United States Patent
Kondo

(12) 
(10) Patent No.: US 8,890,584 B2
(45) Date of Patent: Nov. 18, 2014

(54) SEMICONDUCTOR DEVICE HAVING GEAR DOWN MODE, METHOD OF CONTROLLING SAME, AND INFORMATION PROCESSING SYSTEM

(75) Inventor: Chikara Kondo, Tokyo (JP)

(73) Assignee: PS4 Luxco S.A.R.L., Luxembourg (LU)

( * ) Notice: Subject to any disclaimer, the term of this patent is extended or adjusted under 35 U.S.C. 154(b) by 2 days.

(21) Appl. No.: 13/450,346

(22) Filed: Apr. 18, 2012

(65) Prior Publication Data

US 2012/0268170 A1 Oct. 25, 2012

(30) Foreign Application Priority Data

Apr. 19, 2011 (JP) ................................. 2011-092585

(51) Int. Cl.
H03K 21/00 (2006.01)
H03K 21/10 (2006.01)

(52) U.S. Cl.
CPC ..................................... H03K 21/10 (2013.01)
USPC ...... 327/115; 327/141; 327/295; 365/233.11; 365/233.12; 365/233.13

(58) Field of Classification Search
USPC ............. 365/233.11, 233.12, 233.13, 230.01, 365/233.1; 327/115, 141, 295, 277, 156
See application file for complete search history.

(56) References Cited

U.S. PATENT DOCUMENTS

| | | | |
|---|---|---|---|
| 5,898,331 A * | 4/1999 | Fujita | 365/189.08 |
| 6,185,150 B1 | 2/2001 | Toda et al. | |
| 6,198,689 B1 * | 3/2001 | Yamazaki et al. | 365/233.1 |
| 6,751,154 B2 | 6/2004 | Kuroda | |
| 6,842,373 B2 | 1/2005 | La et al. | |
| 2002/0060945 A1 * | 5/2002 | Ikeda | 365/233 |
| 2003/0053342 A1 | 3/2003 | La et al. | |
| 2003/0198121 A1 | 10/2003 | Kuroda | |
| 2007/0101177 A1 | 5/2007 | Kuroki | |
| 2009/0327792 A1 * | 12/2009 | Salmon et al. | 713/501 |
| 2011/0205818 A1 * | 8/2011 | Moon et al. | 365/194 |

FOREIGN PATENT DOCUMENTS

| | | | |
|---|---|---|---|
| JP | 2000-163962 A | 6/2000 | |
| JP | 2003-059263 A | 2/2003 | |
| JP | 2003-317477 A | 11/2003 | |
| JP | 2007-122804 A | 5/2007 | |

* cited by examiner

Primary Examiner — Lincoln Donovan
Assistant Examiner — Thomas Skibinski
(74) Attorney, Agent, or Firm — McGinn IP Law Group, PLLC

(57) ABSTRACT

Disclosed herein is a device that includes: a frequency division circuit that divides a frequency of a first clock signal to generate a second clock signal; a first logic circuit that receives a first chip select signal and the second clock signal to generate a second chip select signal; and a command generation circuit that is activated based on the second chip select signal, and generates a second command signal based on a first command signal.

20 Claims, 18 Drawing Sheets

| input | | | | output | | |
|---|---|---|---|---|---|---|
| CS2 | RAS1 | CAS1 | WE1 | read0 | write0 | act0 |
| 1 | 0 | 1 | 0 | 1 | 0 | 0 |
| 1 | 0 | 1 | 1 | 0 | 1 | 0 |
| 1 | 1 | 0 | 0 | 0 | 0 | 1 |
| 0 | x | x | x | 0 | 0 | 0 |

SEMICONDUCTOR DEVICE HAVING GEAR DOWN MODE, METHOD OF CONTROLLING SAME, AND INFORMATION PROCESSING SYSTEM

BACKGROUND OF THE INVENTION

1. Field of the Invention

The present invention relates to a semiconductor device and a method of controlling the same, and more particularly to a semiconductor device that operates in synchronization with a clock signal and a method of controlling the same. The present invention also relates to an information processing system that uses such a semiconductor device.

2. Description of Related Art

Synchronous dynamic random access memories (DRAMs) that are widely used as a main memory of a computer operate in synchronization with a clock signal. An external controller supplies external command signals synchronous with an external clock signal to a synchronous DRAM. Inside a DRAM, internal commands are decoded and latched in synchronization with an internal clock signal (see Japanese Patent Application Laid-Open Nos. 2003-59263 and 2003-317477.

Since external command signals from an external controller are supplied to a DRAM in synchronization with an external clock signal, predetermined setup margins and hold margins are needed for all active edges (for example, rising edges) of the external command signals. When using an external clock signal having a high frequency, there has thus been a problem of insufficient setup margins and hold margins for external command signals.

One of the possible methods for increasing the setup margin and hold margin of an external command signal is to divide the frequency of an external clock signal inside a DRAM to generate a frequency-divided clock signal having a frequency lower than that of the external clock signal, and perform a latch operation on the external command signal in synchronization with the frequency-divided clock signal. According to such a method, setup margins and hold margins need not be provided for all active edges of the external command signal, but have only to be provided for every n active edges (n is a power of 2) of the external command signal. This allows greater setup margins and hold margins for the external command signal. As employed herein, such an operation, or an operation mode of enabling the input of an external command signal at every n active edges of the external command signal, will be referred to as a "gear down mode."

Suppose that the gear down mode can be switched ON and OFF. If the frequency of the external clock signal is simply divided when the gear down mode is ON, a large difference occurs between the latch timing when the gear down mode is ON and the latch timing when the gear down mode is OFF. The reason is that when the gear down mode is ON, the external clock signal is passed through the frequency division circuit and the generated frequency-divided clock signal undergoes a predetermined delay. When the gear down mode is OFF, the frequency-division circuit is bypassed and thus causes no delay.

To eliminate such a difference in timing, the internal clock signal needs to be accurately delayed by using delay elements so that the same amount of delay occurs when the gear down mode is OFF as when the gear down mode is ON. The accurate cancellation of a difference in timing needs complicated design with increased design burdens. An element area needed for forming the delay elements also causes a problem of greater chip area.

SUMMARY

In one embodiment, there is provided a semiconductor device that includes: a frequency division circuit that divides a frequency of a first clock signal to generate a second clock signal; a first logic circuit that receives a first chip select signal and the second clock signal to generate a second chip select signal; and a command generation circuit that is activated based on the second chip select signal, and generates a second command signal based on a first command signal.

In another embodiment, there is provided a method of controlling a semiconductor device, that includes: dividing a frequency of a first clock signal to generate a second clock signal; activating, in a first operation mode, a command generation circuit when both the second clock signal and a first chip select signal are activated; activating, in a second operation mode, the command generation circuit when the first chip select signal is activated regardless of the first and second clock signals; and generating a second command signal by supplying a first command signal to the command generation circuit that is activated.

In still another embodiment, there is provided an information processing system that includes: a first semiconductor device that outputs an external clock signal, an external chip select signal, and an external command signal; and a second semiconductor device. The second semiconductor device includes: a clock receiver that receives the external clock signal supplied from the first semiconductor device and outputs the first clock signal; a chip select receiver that receives the external chip select signal supplied from the first semiconductor device and outputs the first chip select signal; a command receiver that receives the external command signal supplied from the first semiconductor device and outputs the first command signal; a frequency division circuit that divides a frequency of the first clock signal to generate a second clock signal; a first logic circuit that receives the first chip select signal and the second clock signal to generate a second chip select signal; and a command generation circuit that is activated based on the second chip select signal, and generates a second command signal based on the first command signal.

BRIEF DESCRIPTION OF THE DRAWINGS

FIG. 8 is an operation waveform chart when the gear down mode is ON;

FIG. 10 is an operation waveform chart of the circuit of the prototype shown in FIG. 9 when the gear down mode is ON;

FIG. 17 is an operation waveform chart for explaining a case where the tCAL mode is OFF and the gear down mode is ON;

FIG. 19 is an operation waveform chart for explaining a case where the tCAL mode is ON and the gear down mode is ON.

DETAILED DESCRIPTION OF THE EMBODIMENT

A representative example of a technical concept of the present invention for solving the problem will be described below. It will be understood that what is claimed is by the present invention is not limited to such a technical concept and is set forth in the appended claims of the present application. Specifically, the technical concept of the present invention is to activate a command generation circuit based on a chip select signal and a frequency-divided clock signal when a gear down mode is ON, while latching a command signal in synchronization with a clock signal that is not frequency-divided. Consequently, when the gear down mode is ON, the command signal can be enabled in every two periods of the clock signal, without causing a difference in latch timing between when the gear down mode is ON and when OFF.

Figure 1:
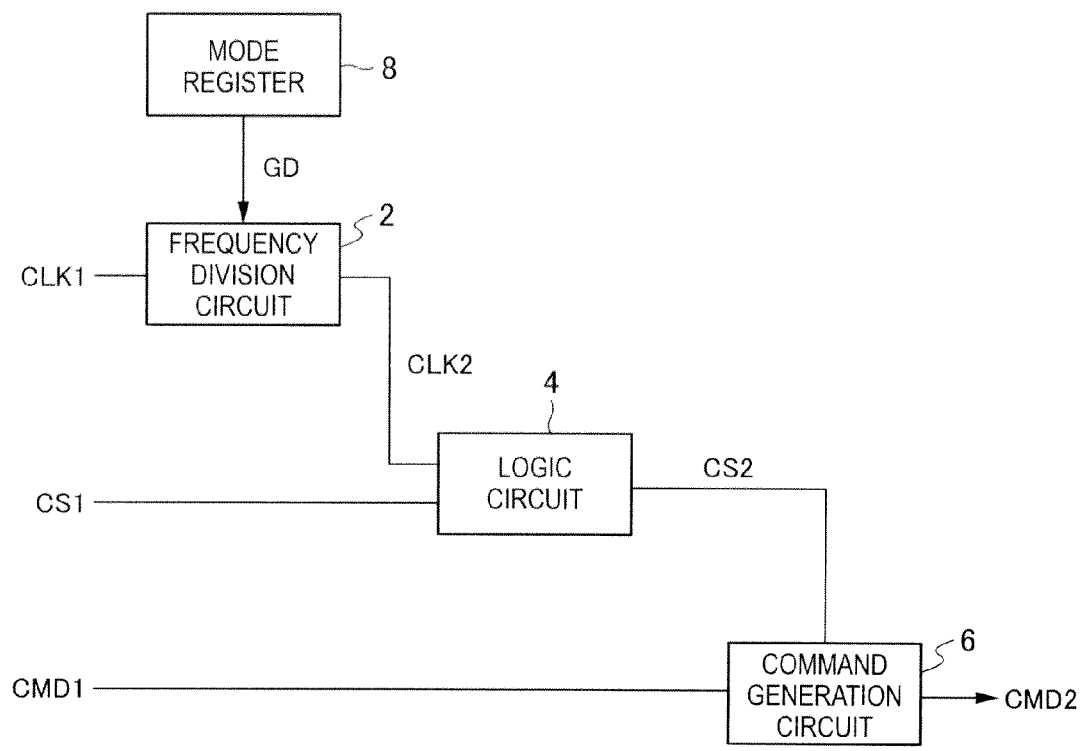
FIG. 1 is a diagram for explaining an embodiment of the present invention.

Referring now to FIG. 1, a semiconductor device according to an embodiment of the present invention includes a frequency division circuit 2, a logic circuit 4, and a command generation circuit 6. The frequency division circuit 2 divides the frequency of a first clock signal CLK1 to generate a second clock signal CLK2. The logic circuit 4 logically synthesizes a first chip select signal CS1 and the second clock signal CLK2 to generate a second chip select signal CS2. The command generation circuit 6 is activated based on the second chip select signal CS2, and generates a second command signal CMD2 based on a first command signal CMD1.

The first clock signal CLK1 is an external clock signal supplied from outside the semiconductor device, or a buffered signal of the same. The first clock signal CLK1 therefore has the same frequency as that of the external clock signal. The external clock signal is a so-called system clock which is supplied from a controller device connected to the semiconductor device. The semiconductor device according to the present embodiment thus operates in synchronization with the external clock signal.

The first chip select signal CS1 is an external chip select signal supplied from outside the semiconductor device, or a buffered signal of the same. The first chip select signal CS1 is in synchronization with the first clock signal CLK1. The external chip select signal is a signal supplied from the controller device. The external chip select signal is used to select a semiconductor device to activate when a plurality of semiconductor devices to be exclusively selected are connected to a single controller device.

The first command signal CMD1 is an external command signal supplied from outside the semiconductor device, or a buffered signal of the same. The first command signal CMD1 is in synchronization with the first clock signal CLK1. The external command signal is a signal supplied from the controller device. The external command signal is used to specify the content of operation (such as a read operation and a write operation) of the semiconductor device selected by the external chip select signal.

The semiconductor device according to the present embodiment has a gear down mode. Whether the gear down mode is ON or OFF is set in a mode register 8. A gear down signal GD output from the mode register 8 is supplied to the frequency division circuit 2. If the gear down signal GD indicates that the gear down mode is ON, the frequency division circuit 2 divides the frequency of the first clock signal CLK1 to generate the second clock signal CLK2. If the gear down signal GD indicates that the gear down mode is OFF, the frequency division circuit 2 fixes the logic level of the second clock signal CLK2.

If the gear down mode is OFF, the first chip select signal CS1 and the first command signal CMD1 are enabled at all active edges (for example, all rising edges) of the first clock signal CLK1. On the other hand, if the gear down mode is ON, the first chip select signal CS1 and the first command signal CMD1 are enabled at every n active edges (n is a power of 2; for example, every two rising edges) of the first clock signal CLK1. Setting the gear down mode ON therefore increases the setup margins and hold margins of the first chip select signal CS1 and the first command signal CMD1.

If the gear down mode is OFF, the logic level of the second clock signal CLK2 is fixed. This makes the waveform of the second chip select signal CS2 the same as that of the first chip select signal CS1. Consequently, the command generation circuit 6 is activated in synchronization with the first chip select signal CS1, and generates the second command signal CMD2 based on the first command signal CMD1. An example of the command generation circuit 6 is a decoder, in which case the command generation circuit 6 generates the second command signal CMD2 by decoding the first command signal CMD1. The second command signal CMD2 is supplied to a not-shown internal circuit, which executes an operation (such as a read operation and a write operation) specified by the content of the second command signal CMD2. For example, when the second command signal CMD2 is latched in synchronization with the first clock signal CLK1, the not-shown internal circuit can perform an operation based on the first command signal CMD1 supplied at all active edges of the first clock signal CLK1.

On the other hand, if the gear down mode is ON, the frequency-divided second clock signal CLK2 and the first chip select signal CS1 are logically synthesized into the second chip select signal CS2. Consequently, the first chip select signal CS1 is enabled only in periods where the second clock signal CLK2 has a certain logic level. The first chip select signal CS1 supplied in the enabled periods is output as the second chip select signal CS2, which activates the command generation circuit 6. For example, when the second command signal CMD2 is latched in synchronization with the first clock signal CLK1, the not-shown internal circuit performs an operation based on the first command signal CMD1 that is supplied in synchronization with every n active edges of the first clock signal CLK1. For example, the first chip select signal CS1 and the first command signal CMD1 in synchronization with even-numbered active edges of the first clock signal CLK1 are enabled. The first chip select signal CS1 and the first command signal CMD1 in synchronization with odd-numbered active edges of the first clock signal CLK1 are disabled. This increases setup margins and hold margins.

As described above, the semiconductor device according to the present embodiment can increase the setup margins and hold margins of the first chip select signal CS1 and the first command signal CMD1 in the gear down mode. Sufficient setup margins and hold margins can thus be provided even when the external clock signal has a high frequency. In addition, since the frequency-divided second clock signal CLK2 need not be used as a latch timing signal, there occurs no difference in the latch timing of the command signal between when the gear down mode is ON and when OFF.

More detailed embodiment of the present invention will be explained below.

Figure 2:
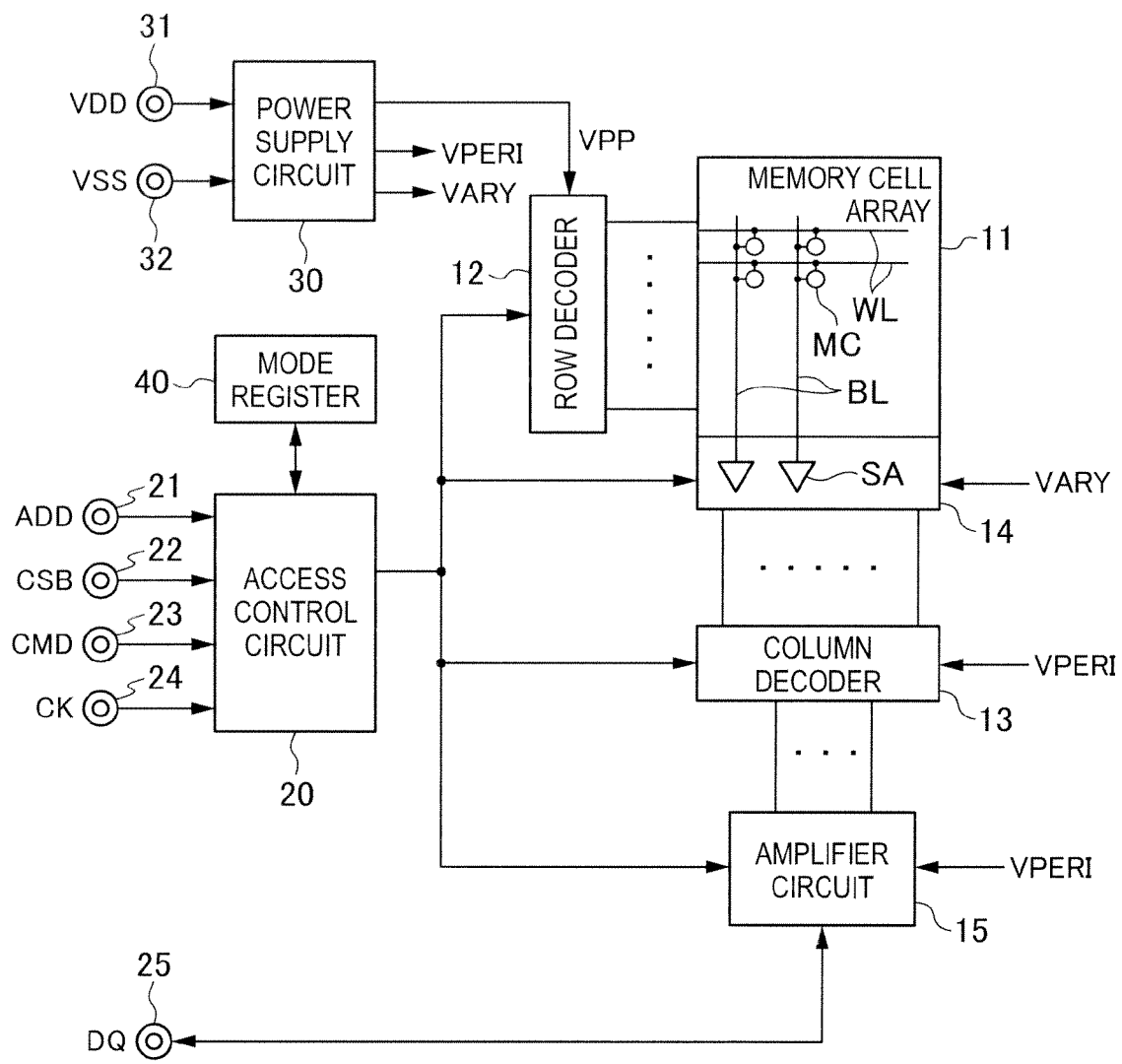
FIG. 2 is a block diagram showing the overall configuration of a semiconductor device 10 according to a preferred embodiment of the present invention.

Turning to FIG. 2, the semiconductor device 10 according to the present embodiment is a DRAM, and includes a memory cell array 11. The memory cell array 11 includes a plurality of word lines WL and a plurality of bit lines BL which intersect each other. Memory cells MC are arranged at the intersections of the word lines WL and the bit lines BL. The word lines WL are selected by a row decoder 12. The bit lines BL are selected by a column decoder 13. The bit lines BL are connected to respective corresponding sense amplifiers SA in a sense circuit 14. Bit lines BL selected by the column decoder 13 are connected to an amplifier circuit 15 through sense amplifiers SA.

The operation of the row decoder 12, the column decoder 13, the sense circuit 14, and the amplifier circuit 15 is controlled by an access control circuit 20. An address signal ADD, an external chip select signal CSB, an external command signal CMD, and an external clock signal CK are supplied to the access control circuit 20 through an address terminal 21, a chip select terminal 22, a command terminal 23, and a clock terminal 24, respectively. The access control circuit 20 controls the row decoder 12, the column decoder 13, the sense circuit 14, and the amplifier circuit 15 based on the address signal ADD, the external chip select signal CSB, the external command signal CMD, and the external clock signal CK.

Specifically, when the external chip select signal CSB and the external command signal CMD indicate an active operation of the semiconductor device 10, the address signal ADD is supplied to the row decoder 12. In response, the row decoder 12 selects a word line WL that is designated by the address signal ADD, whereby corresponding memory cells MC are connected to respective bit lines BL. The access control circuit 20 then activates the sense circuit 14 at predetermined timing.

When the external chip select signal CSB and the external command signal CMD indicate a read operation or a write operation of the semiconductor device 10, the address signal ADD is supplied to the column decoder 13. In response, the column decoder 13 connects bit lines BL designated by the address signal ADD to the amplifier circuit 15. Consequently, in a read operation, read data DQ read from the memory cell array 11 through sense amplifiers SA is output from a data terminal 25 to outside through the amplifier circuit 15. In a write operation, write data DQ supplied from outside through the data terminal 25 is written to memory cells MC through the amplifier circuit 15 and sense amplifiers SA.

The access control circuit 20 operates in synchronization with the external clock signal CK. The semiconductor device 10 according to the present embodiment has a gear down mode. If the gear down mode is OFF (second operation mode), the external chip select signal CSB and the external command signal CMD are enabled at all rising edges of the external clock signal CK. On the other hand, if the gear down mode is ON (first operation mode), the external chip select signal CSB and the external command signal CMD are enabled at even-numbered rising edges of the external clock signal CK. The external chip select signal CSB and the external command signal CMD input at odd-numbered rising edges are disabled.

Whether the gear down mode is ON or OFF is set by a mode register 40. The set value of the mode register 40 can be updated by issuing a mode register set command through the command terminal 23 and inputting a new set value through the address terminal 21.

Each of the foregoing circuit blocks operates with a predetermined internal voltage as its power supply. Such internal power supplies are generated by a power supply circuit 30 shown in FIG. 2. The power supply circuit 30 receives an external power potential VDD and a ground potential VSS which are supplied through power supply terminals 31 and 32, respectively. Based on the potentials, the power supply circuit 30 generates internal power potential VPP, VPERI, VARY, etc. The internal power potential VPP is generated by boosting the external power potential VDD. The internal power potentials VPERI and VARY are generated by stepping down the external power potential VDD.

The internal power potential VPP is mainly used in the row decoder 12. The row decoder 12 drives a word line WL that is selected based on the address signal ADD to the VPP level, thereby making cell transistors included in memory cells MC conducting. The internal power potential VARY is used in the sense circuit 14. When the sense circuit 14 is activated, the sense circuit 14 drives either one of each pair of bit lines to the VARY level and the other to the VSS level, thereby amplifying read data that is read out from the memory cells. The internal power potential VPERI is used as the operating voltage of most of the peripheral circuits such as the access control circuit 20. The use of the internal power potential VPERI lower than the external power potential VDD as the operating voltage of the peripheral circuits reduces the power consumption of the semiconductor device 10.

Figure 3:
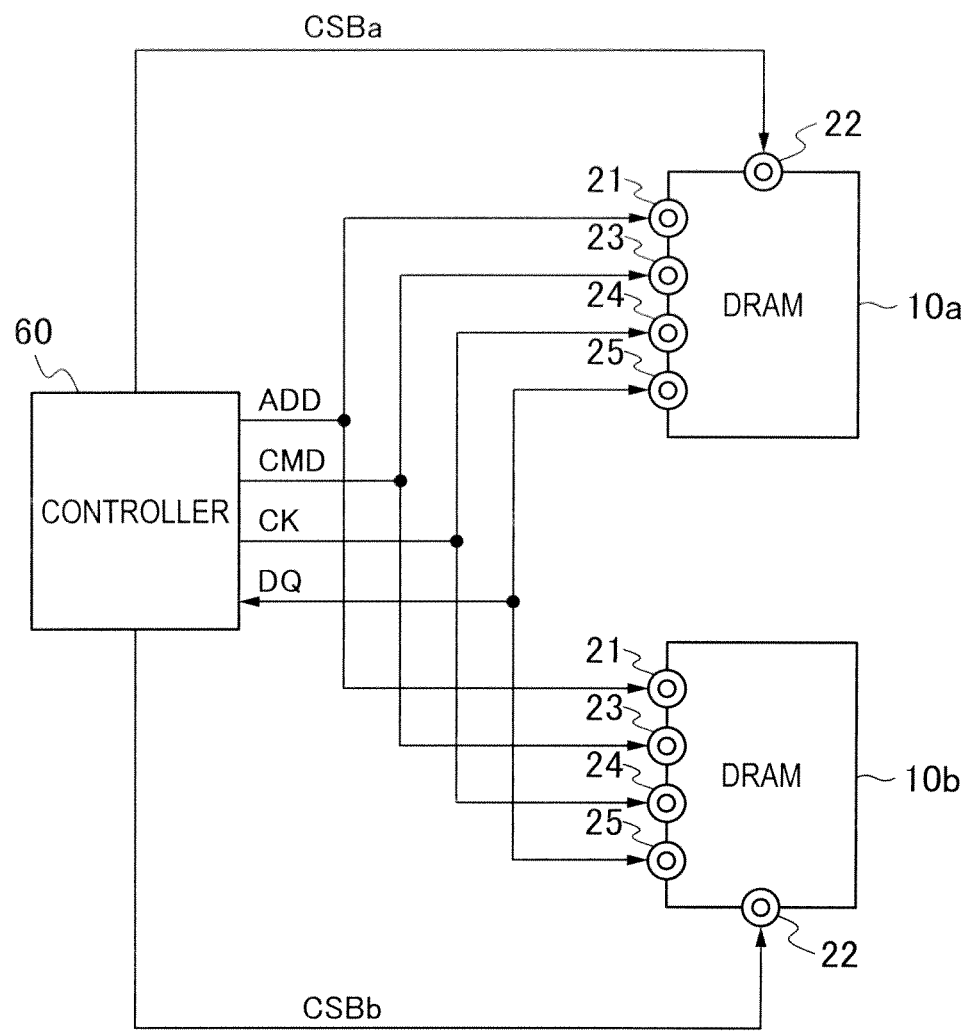
FIG. 3 is a block diagram of an information processing system 50 that uses semiconductor devices 10 according to the present embodiment.

Turning to FIG. 3, the information processing system 50 includes two DRAMs 10a and 10b and a controller 60 for controlling the DRAMs 10a and 10b. The DRAMs 10a and 10b and the controller 60 are integrated into respective different semiconductor chips, and mounted on the same circuit board (for example, a motherboard). The DRAMs 10a and 10b each correspond to the semiconductor device 10 shown in FIG. 2, and have the same circuit configuration.

As shown in FIG. 3, the DRAMs 10a and 10b are connected in common to the controller 60, except the wiring through which external chip select signals CSBa and CSBb are supplied. An address signal ADD output from the controller 60 is supplied to address terminals 21 of the DRAMs 10a and 10b in common. An external command signal CMD output from the controller 60 is supplied to command terminals 23 of the DRAMs 10a and 10b in common. An external clock signal CK output from the controller 60 is supplied to clock terminals 24 of the DRAMs 10*a* and 10*b* in common. Write data DQ output from the controller 60 is supplied to data terminals 25 of the DRAMs 10*a* and 10*b* in common. Pieces of read data DQ output from the data terminals 25 of the DRAMs 10*a* and 10*b* are both input to the controller 60.

The external chip select signals CSBa and CSBb output from the controller 60 are separately supplied to the respective DRAMs 10*a* and 10*b*. The external chip select signal CSBa is a signal for selecting the DRAM 10*a*. The external chip select signal CSBb is a signal for selecting the DRAM 10*b*. The address signal ADD, the external command signal CMD, and the like that are supplied to the DRAMs 10*a* and 10*b* in common are thereby enabled for either one of the DRAMs 10*a* and 10*b*. The controller 60 sets a gear down mode and a tCAL mode to be described later ON/OFF in each of the two DRAMs 10*a* and 10*b* by using at least some of the external chip select signals CSBa and CSBb, the address signal ADD, the external command signal CMD, the external clock signal CK, and write data DQ.

Next, the circuit configuration of essential parts of the access control circuit 20 will be described in detail.

Figure 4:
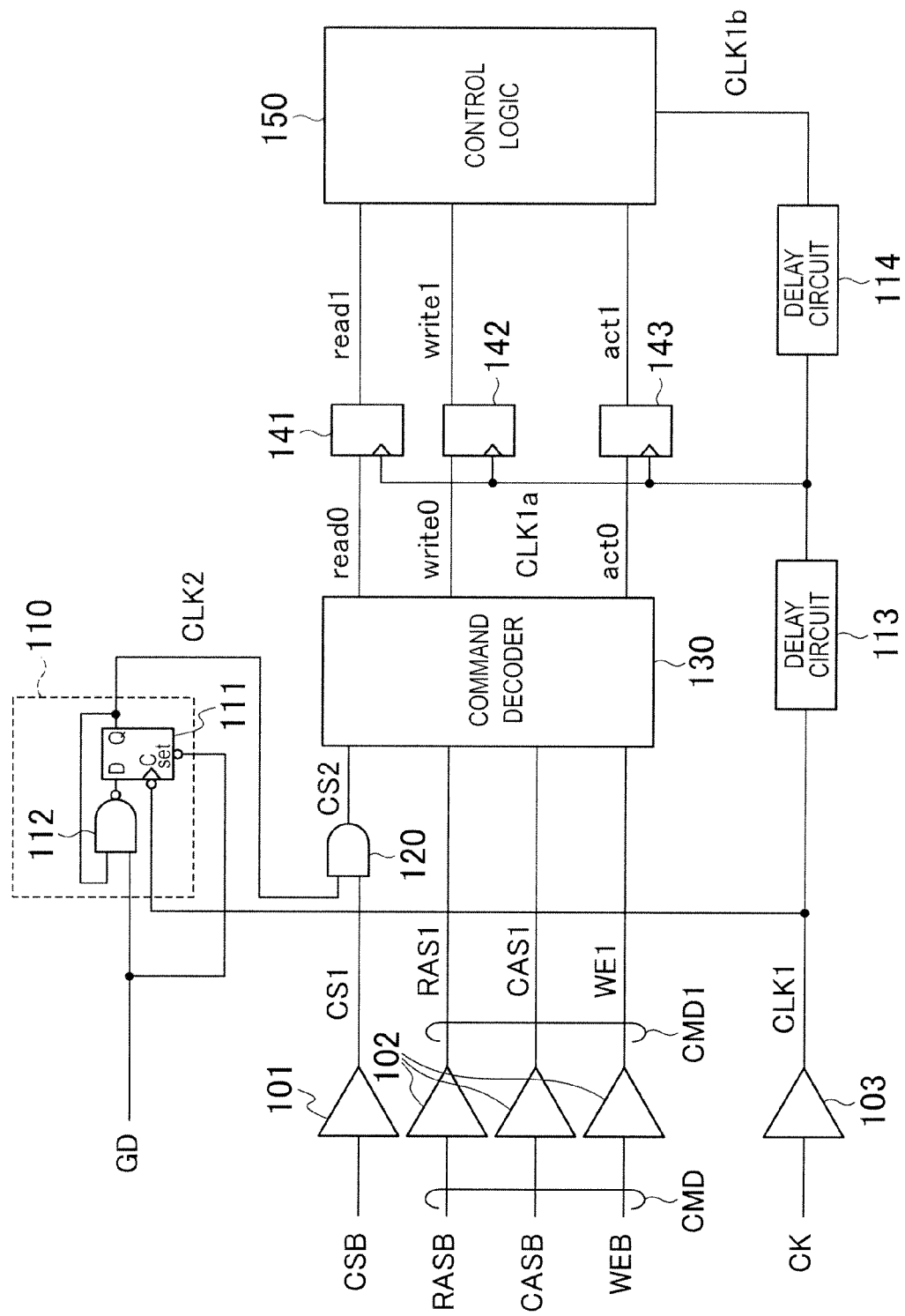
FIG. 4 is a block diagram showing the circuit configuration of essential parts of the access control circuit 20 according to a first embodiment of the present invention.

The circuit shown in FIG. 4 includes a chip select receiver 101, command receivers 102, and a clock receiver 103. The chip select receiver 101 receives an external chip select signal CSB supplied from outside, and outputs a first chip select signal CS1. The command receivers 102 receive external command signals CMD supplied from outside, and output first command signals CMD1. The clock receiver 103 receives an external clock signal CK supplied from outside, and outputs a first clock signal CLK1. The receivers 101 to 103 each determine the logic level of their input signal, and generate an output signal by inverting the logic level of the input signal based on the result of determination. For example, the first chip select signal CS1 is an inverted signal of the external chip select signal CSB.

The external command signals CMD include a row address strobe signal RASE, a column address strobe signal CASE, and a write enable signal WEB. The first command signals CMD1 include a row address strobe signal RAS1, a column address strobe signal CAS1, and a write enable signal WE1.

The circuit shown in FIG. 4 further includes a frequency division circuit 110. The frequency division circuit 110 is a circuit for dividing the frequency of the first clock signal CLK1 to generate a second clock signal CLK2. The frequency division circuit 110 includes a flip-flop circuit 111 and a two-input NAND gate circuit 112. A gear down signal GD is supplied to an input node of the NAND gate circuit 112. The other input node of the NAND gate circuit 112 is connected to an output node Q of the flip-flop circuit 111. The output node of the NAND gate circuit 112 is connected to an input node D of the flip-flop circuit 111. The first clock signal CLK1 is supplied to a clock node C of the flip-flop circuit 111. The flip-flop circuit 111 latches the logic level of the input node D in synchronization with a falling edge of the first clock signal CLK1.

Consequently, when the gear down signal GD is at a high level, the logic level of the second clock signal CLK2 is inverted each time a falling edge of the first clock signal CLK1 comes. It is important to note that the falling edge of the first clock signal CLK1 is used as the timing for inverting the second clock signal CLK2. That is, inverting the second clock signal CLK2 in synchronization with the falling edge of the first clock signal CLK1 can locate the timing of a rising edge, or active edge, of the first clock signal CLK1 generally in the center of the period where the second clock signal CLK2 is at a high level (or low level).

The flip-flop circuit 111 has a set node "set." When the gear down signal GD is at a low level, the logic level of the second clock signal CLK2 output from the output node Q is fixed to a high level.

The gear down signal GD is supplied from the mode register 40 shown in FIG. 2. The gear down signal DG indicates whether the gear down mode is ON or OFF. Specifically, the gear down signal GD of high level indicates that the gear down mode is ON. The gear down signal GD of low level indicates that the gear down mode is OFF. When the gear down mode is ON, the second clock signal CLK2 has a period twice that of the first clock signal CLK1 (one-half frequency). When the gear down mode is OFF, the second clock signal CLK2 is fixed to a high level.

The second clock signal CLK2 and the first chip select signal CS1 are supplied to an AND gate circuit 120 (first logic circuit) shown in FIG. 4. A second chip select signal CS2, the output of the AND gate circuit 120, is supplied to a command decoder (command generation circuit) 130. The command decoder 130 is a circuit for decoding the first command signals CMD1. The command decoder 130 is activated when the second chip select signal CS2 is a high level.

Figures 5, 6:
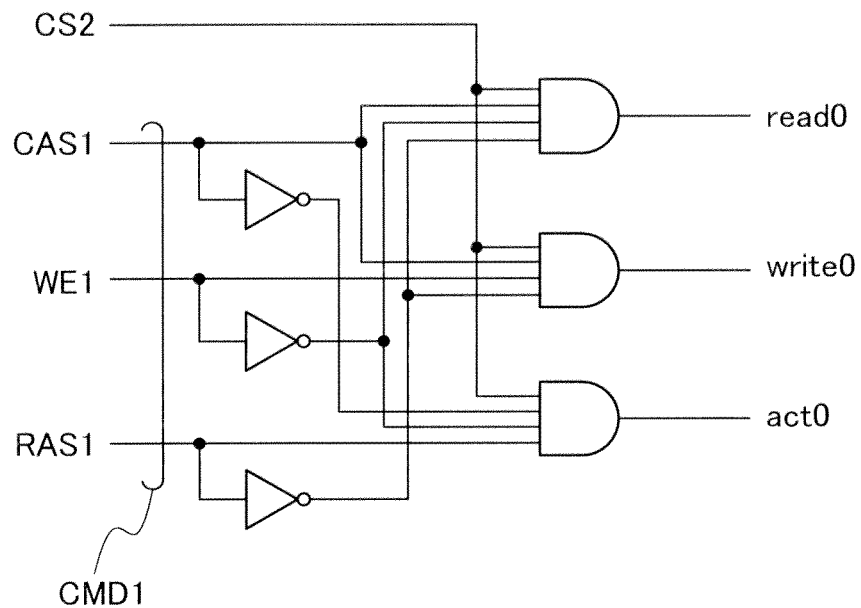
FIG. 5 is a circuit diagram of the command decoder 130 shown in FIG. 4.
FIG. 6 shows a truth table of the command decoder 130 shown in FIG. 4.

As shown in FIG. 5, the command decoder 130 includes three AND gate circuits. The second chip select signal CS2 is input to all the three AND gate circuits. If the second chip select signal CS2 is at a low level, then the outputs of the command decoder 130, namely, a read signal read0, write signal write0, and an active signal act0 (second command signal) are all deactivated to a low level. If the second chip select signal CS2 is at a high level, the read signal read 0, the write signal write0, or the active signal act0 is activated to a high level depending on a combination of the row address strobe signal RAS1, the column address strobe signal CAS1, and the write enable signal WE1 which constitute the first command signals CMD1. FIG. 6 shows specific combinations of the first command signals CMD1.

Returning to FIG. 4, the read signal read0, the write signal write0, and the active signal act0 generated by the command decoder 130 are supplied to respective corresponding flip-flop circuits 141 to 143 (first latch circuit). The flip-flop circuits 141 to 143 latch the read signal read0, the write signal write0, and the active signal act0 in synchronization with a first clock signal CLK1*a* that is delayed by a delay circuit 113, and output the signals as a read signal read1, a write signal write1, and an active signal act1, respectively. The delay circuit 113 is a circuit for giving the first clock signal CLK1 the same amount of delay as that of the command decoder 130. The delay circuit 113 functions to adjust the latch timing of the flip-flop circuits 141 to 143. Specifically, the delay circuit 113 may include the same number of stages of logic circuits as the number of logic stages of the logic circuits constituting the command decoder 130. The delay circuit 113 can thus be designed extremely easily, with a minimum footprint on the chip.

The read signal read1, the write signal write1, and the active signal act1 are supplied to control logic 150 included in the access control circuit 20. Receiving the read signal read1, the write signal write1, and the active signal act1, the control logic 150 controls the row decoder 12, the column decoder 13, and the like shown in FIG. 2 in synchronization with a first clock signal CLK1*b* that is delayed by a delay circuit 114. The delay circuit 114 is a circuit for giving the first clock signal CLK1*a* the same amount of delay as that caused by the flip-flop circuits 141 to 143. The delay circuit 114 functions to adjust the operation timing of the control logic 150. Specifically, the delay circuit 114 may include the same number of stages of logic circuits as the number of logic stages of the logic circuits constituting the flip-flop circuits 141 to 143. The delay circuit 114 can thus be designed extremely easily, with a minimum footprint on the chip.

The circuit configuration of essential parts of the access control circuit 20 according to the first embodiment has been described above. Next, the operation of the access control circuit 20 according to the present embodiment will be described.

The operation of the access control circuit 20 in which the gear down mode is OFF will be described with reference to FIG. 7.

Figure 7:
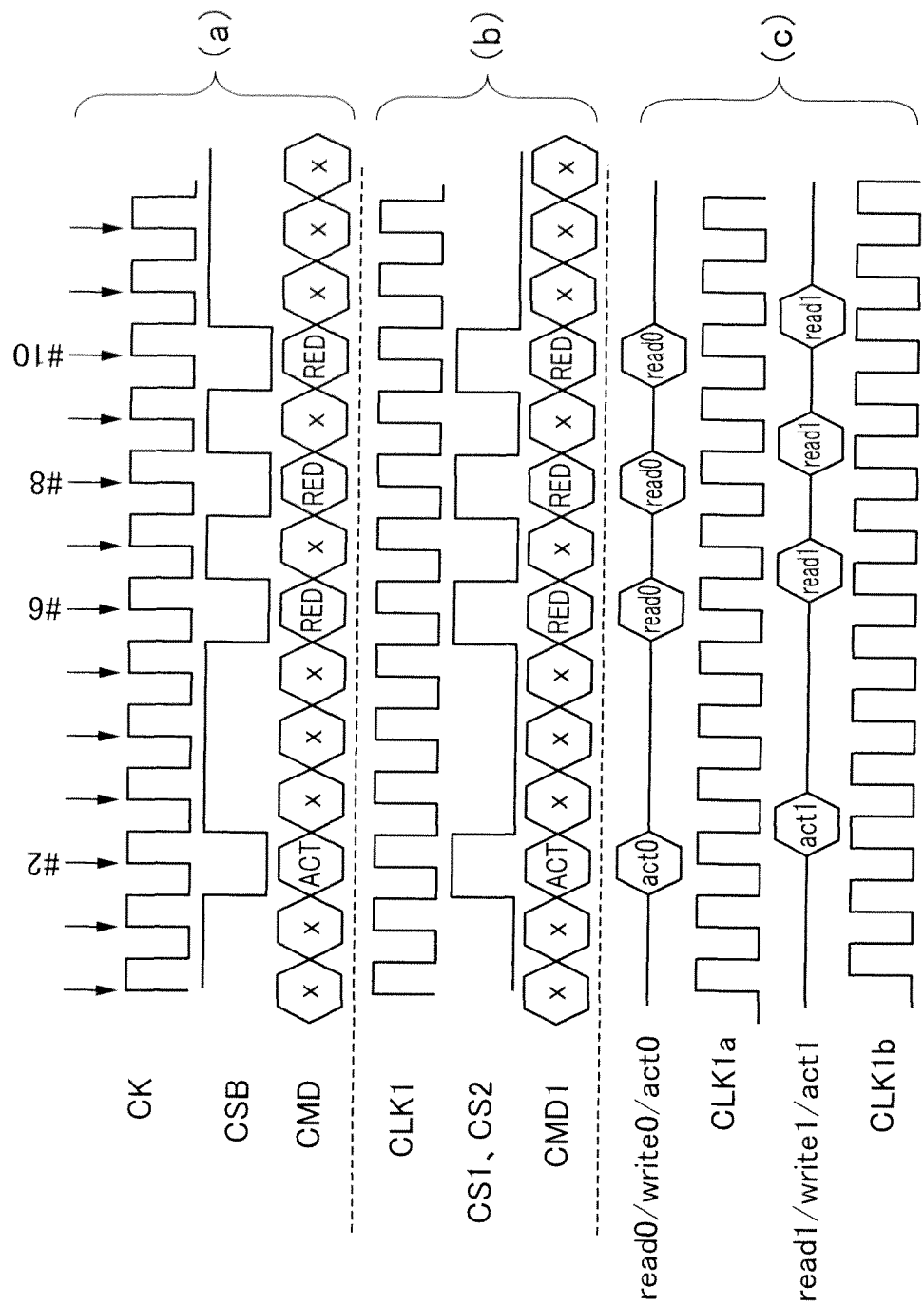
FIG. 7 is an operation waveform chart when the gear down mode is OFF.

In FIG. 7, signals shown in area (a) represent ones before input to the receivers 101 to 103. Signals shown in area (b) represent ones that are output from the receivers 101 to 103 and yet to be input to the command decoder 130. Signals shown in area (c) represent ones that are used in the command decoder 130 or subsequent circuits. The same holds for subsequent waveform charts.

In the example shown in FIG. 7, an active command (ACT) is issued in synchronization with a rising edge #2 of the external clock signal CK. A read command (RED) is issued in synchronization with rising edges #6, #8, and #10 of the external clock signal CK. An active command (ACT) refers to a combination of external command signals CMD based on which the active signal act0 is generated. A read command (RED) refers to a combination of external command signals CMD based on which the read signal read0 is generated. When such commands are issued, the external chip select signal CSB corresponding to this semiconductor device 10 is activated to a low level.

When the gear down mode is OFF, the first chip select signal CS1 and the second chip select signal CS2 have the same waveform. The command decoder 130 is activated each time the second chip select signal CS2 becomes a high level, and decodes the first command signals CMD1 that are supplied at the timing when the second chip select signal CS2 becomes a high level. Consequently, the command decoder 130 generates the active signal act0 and the read signal read0. Since the first chip select signal CS1 is activated over a period of one clock cycle of the external clock signal CK, the command decoder 130 is also activated over a period of one clock cycle. The active signal act0 and the read signal read0 also have an activation period equivalent to a period of one clock cycle of the external clock signal CK.

The active signal act0 and the read signal read0 generated are latched by the flip-flop circuits 143 and 141 in synchronization with the first clock signal CLK1a, and output as the active signal act1 and the read signal read1. The active signal act1 and the read signal read1 are input to the control logic 150, and processed in synchronization with the first clock signal CLK1b.

As described above, when the gear down mode is OFF, all external command signals CMD input in synchronization with rising edges of the external clock signal CK are enabled. The commands are processed at the same frequency as that of the external clock signal CK.

The operation of the access control circuit 20 in which the gear down mode is ON will be described with reference to FIG. 8.

When the gear down mode is ON, only even-numbered rising edges of the external clock signal CK are enabled for the external chip select signal CSB and external command signals CMD. In the example shown in FIG. 8, an active command (ACT) is issued in synchronization with a rising edge #2 of the external clock signal CK. A read command (RED) is issued in synchronization with rising edges #6, #8, and #10 of the external clock signal CK. When such commands are issued, the external chip select signal CSB corresponding to this semiconductor device 10 is activated to a low level. With the gear down mode ON, the frequency of the external clock signal CK can be considered to be reduced by half since only even-numbered rising edges of the external clock signal CK are enabled. This allows long pulse width for the external chip select signal CSB and the external command signals CMD, whereby sufficient setup margins and hold margins can be provided.

When the gear down mode is ON, the first chip select signal CS1 and the second clock signal CLK2 are logically ANDed and synthesized into the second chip select signal CS2. The second clock signal CLK2 has a high-level period equivalent to a period from one falling edge to another of the first clock signal CLK1. As described above, a rising edge of the first clock signal CLK1 is located generally in the center of the period when the second clock signal CLK2 is at a high level. Consequently, the external command signals CMD input in synchronization with rising edges of the external clock signal CK are decoded by the command decoder 130 in synchronization with the second clock signal CLK2 without fail. The command decoder 130 thereby generates the active signal act0 and the read signal read0.

Note that the active signal act0 and the read signal read0 are given a period as long as one clock cycle of the external clock signal CK. In other words, according to the present embodiment, the active signal act0 and the read signal read0 (needless to say, the write signal write0 as well) have a pulse width of one clock cycle regardless of whether the gear down mode is ON or OFF. The first clock signal CLK1a supplied to the flip-flop circuits 141 to 143 therefore need not be switched based on whether the gear down mode is ON or OFF. The waveforms shown in area (c) of FIG. 8 are in close agreement with those shown in area (c) of FIG. 7.

When the gear down mode is ON, only external command signals CMD input in synchronization with even-numbered rising edges of the external clock signal CK are enabled. This provides sufficient setup margins and hold margins for the external chip select signal CSB and external command signals CMD.

Figure 9:
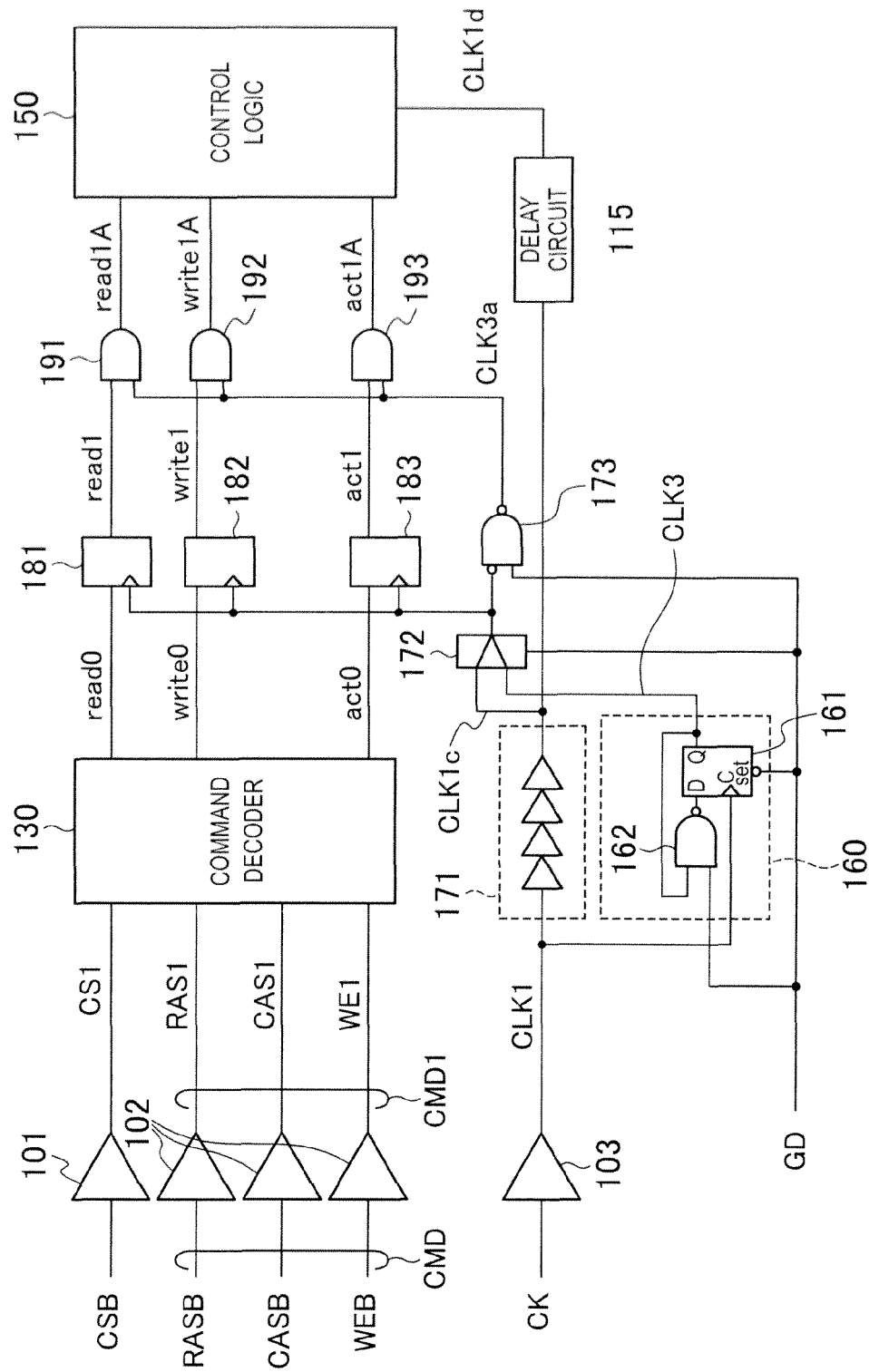
FIG. 9 is a block diagram showing the circuit configuration of essential parts of the access control circuit 20 according to a prototype in the course of making the present invention.

In a device shown in FIG. 9 that the inventor have conceived as a prototype in the course of making the present invention, the latch timing of flip-flog circuits 181 to 183 arranged in the subsequent stage of the command decoder 130 is changed depending on whether the gear down mode is ON or OFF. Specifically, there is provided a frequency division circuit 160 which has a circuit configuration similar to that of the frequency division circuit 110 shown in FIG. 4. The frequency division circuit 160 divides the frequency of the first clock signal CLK1 to generate a third clock signal CLK3. The third clock signal CLK3 has a period twice that of the first clock signal CLK1. The frequency division circuit 160 includes a flip-flop circuit 161 and a NAND gate circuit 162. The frequency division circuit 160 has the same connection relationship as that of the frequency division circuit 110 shown in FIG. 4. Note that the flip-flop circuit 161 inverts the third clock signal CLK3 in synchronization with a rising edge, not a falling edge, of the first clock signal CLK1.

A delay circuit 171 gives the same amount of delay as that of the frequency division circuit 160 to the first clock signal CLK1 that is not frequency-divided, thereby generating a first clock signal CLK1c. The first clock signal CLK1c and the third clock signal CLK3 are supplied to a selector 172, which outputs either one of the clock signals. The selector 172 makes the selection based on the gear down signal GD. If the gear down signal GD is at a low level (gear down mode OFF), the first clock signal CLK1c is selected. If the gear down signal GD is at a high level (gear down mode ON), the third clock signal CLK3 is selected. The first clock signal CLK1c or the third clock signal CLK3 selected by the selector 172 is then supplied to the flip-flop circuits 181 to 183 as a latch timing signal.

The clock signal selected by the selector 172 is also supplied to AND gate circuits 191 to 193 through a NAND gate circuit 173. The AND gate circuits 191 to 193 are interposed between the flip-flop circuits 181 to 183 and the control logic 150. The AND gate circuits 191 to 193 function to reduce the pulse width of a command when the gear down mode is ON. The gear down signal GD is supplied to the other input node of the NAND gate circuit 173. A third clock signal CLK3a, the output of the NAND gate circuit 173, is thus fixed to a high level when the gear down signal GD is at a low level (gear down mode OFF). When the gear down signal GD is at a high level (gear down mode ON), the third clock signal CLK3a, the output of the NAND gate circuit 173, has the same waveform as that of the third clock signal CLK3 output from the selector 172.

A read signal read1A, a write signal write1A, and an active signal act1A past the AND gate circuits 191 to 193 are supplied to the control logic 150. The control logic 150 processes the read signal read1A, the write signal 1A, and the active signal act1A in synchronization with a first clock signal CLK1d that is delayed by a delay circuit 115. The delay circuit 115 is a circuit for giving the first clock signal CLK1c the same amount of delay as that caused by the flip-flop circuits 181 to 183 and the AND gate circuits 191 to 193. However, an accurate timing adjustment is not always easy because of the presence of the selector 172 and the like on the line of the first clock signal CLK1c.

Figure 8:
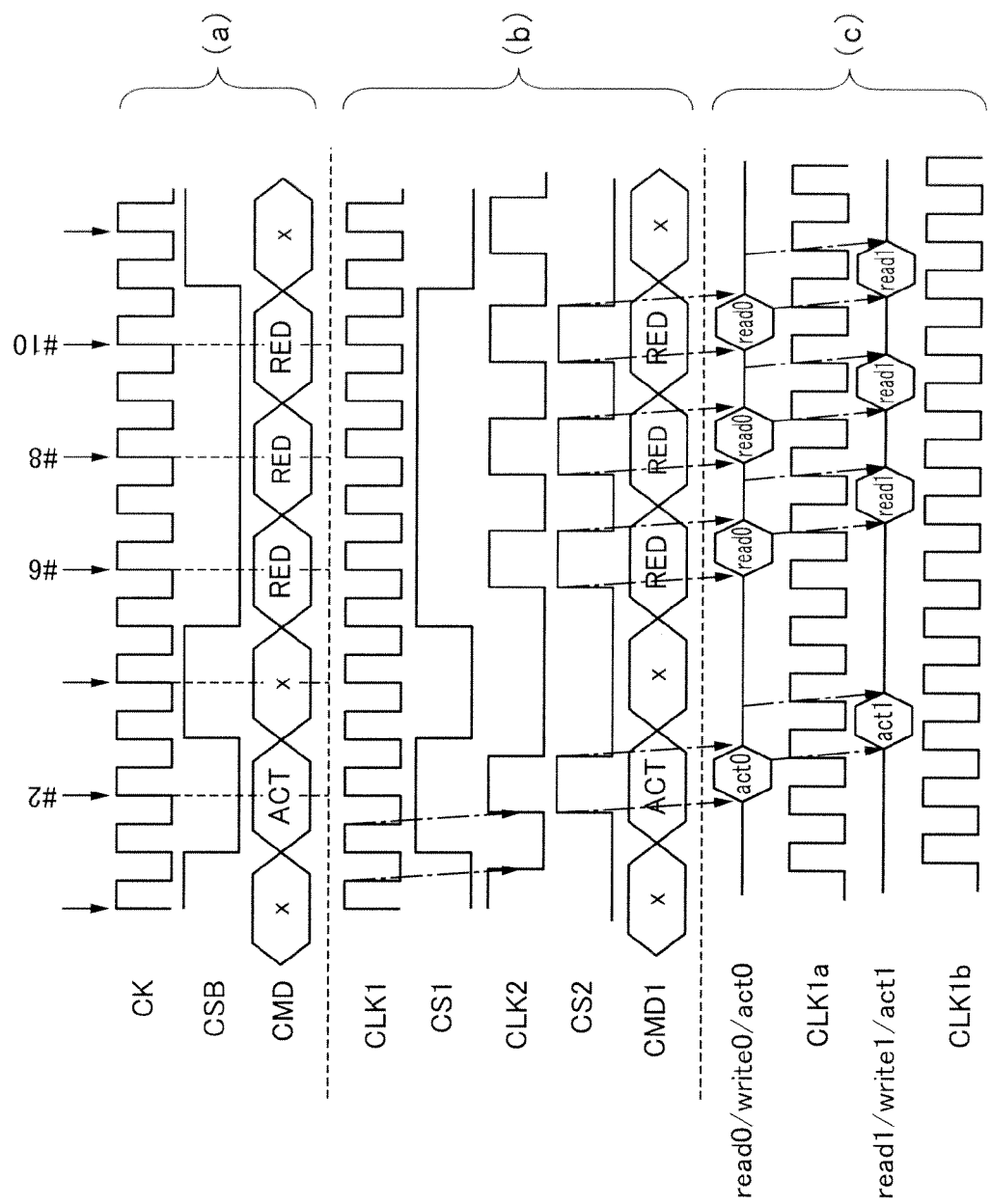
Figure 10:
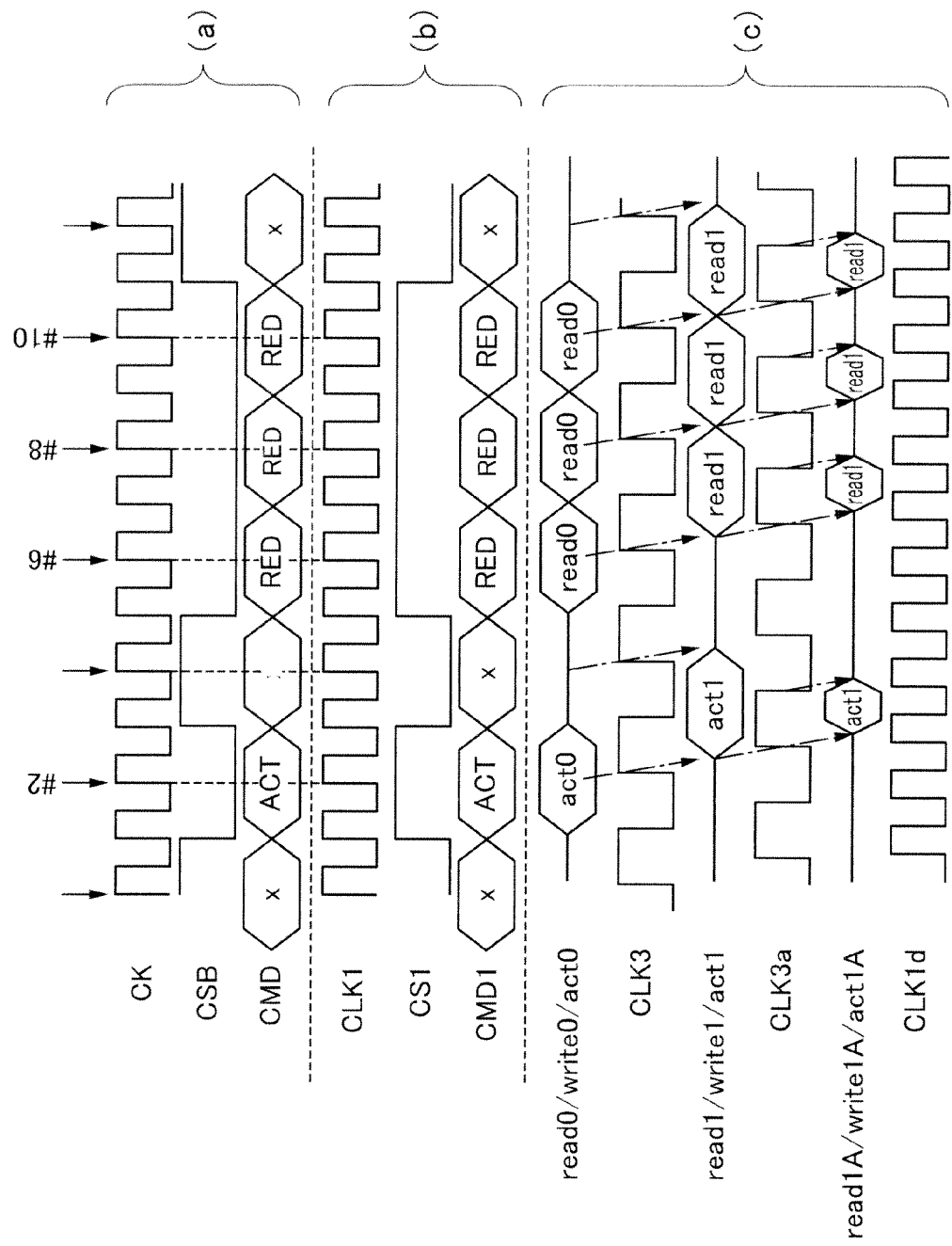

In the example shown in FIG. 10, the external chip select signal CSB and external command signals CMD have the same input timing as in the example shown in FIG. 8. The signal waveforms shown in areas (a) and (b) of FIG. 10 therefore generally coincide with those shown in areas (a) and (b) of FIG. 8. In the prototype example, the command decoder 130 is activated by the first chip select signal CS1. If the gear down mode is ON and the external chip select signal CSB thus has a long pulse width, the generated read signal read0, write signal write0, and active signal act0 also increase in pulse width accordingly.

When the gear down mode is ON, the read signal read0, the write signal write0, and the active signal act0 are latched by the flip-flop circuits 181 to 183 in synchronization with the frequency-divided third clock signal CLK3. Consequently, only external command signals CMD input in synchronization with even-numbered rising edges of the external clock signal CK are enabled. The read signal read1, the write signal write1, and the active signal act1 output from the flip-flop circuits 181 to 183 have a pulse width longer than one clock cycle (up to two clock cycles). Such signals are then reduced to a pulse width of one clock cycle by the AND gate circuits 191 to 193 before input to the control logic 150.

As described above, the circuit of the comparison example is also capable of turning the gear down mode ON/OFF. According to the prototype example, however, the frequency-divided third clock signal CLK3 lags behind the first clock signal CLK1 in phase. In order to latch the outputs of the command decoder 130 at the same timing regardless of whether the gear down mode is ON or OFF, the delay circuit 171 needs to be inserted into the main clock line. This not only complicates the timing adjustment and increases design time, but also reduces setup margins and hold margins. The formation of the delay circuit 171 also causes a problem of increased chip area. In the prototype example, the selector 172 which switches based on whether the gear down mode is ON or OFF needs to be inserted into the main clock line. This also contributes to smaller setup margins and hold margins.

In contrast, according to the present embodiment, the delay circuit 171 or the like need not be inserted into the main clock line. All the problems mentioned above can thus be solved.

In the prototype example, the pulse widths of the read signal read1, the write signal write1, and the active signal act1 need to be reduced to one clock cycle by using the AND gate circuits 191 to 193. This results in lower access speed and increased chip size.

In contract, according to the present embodiment, the signals output from the command decoder 130 have a pulse width of one clock cycle regardless of whether the gear down mode is ON or OFF. Unlike the prototype example, there is no need to reduce a pulse width.

A first modification of the access control circuit 20 will be described with reference to FIG. 11.

Figure 11:
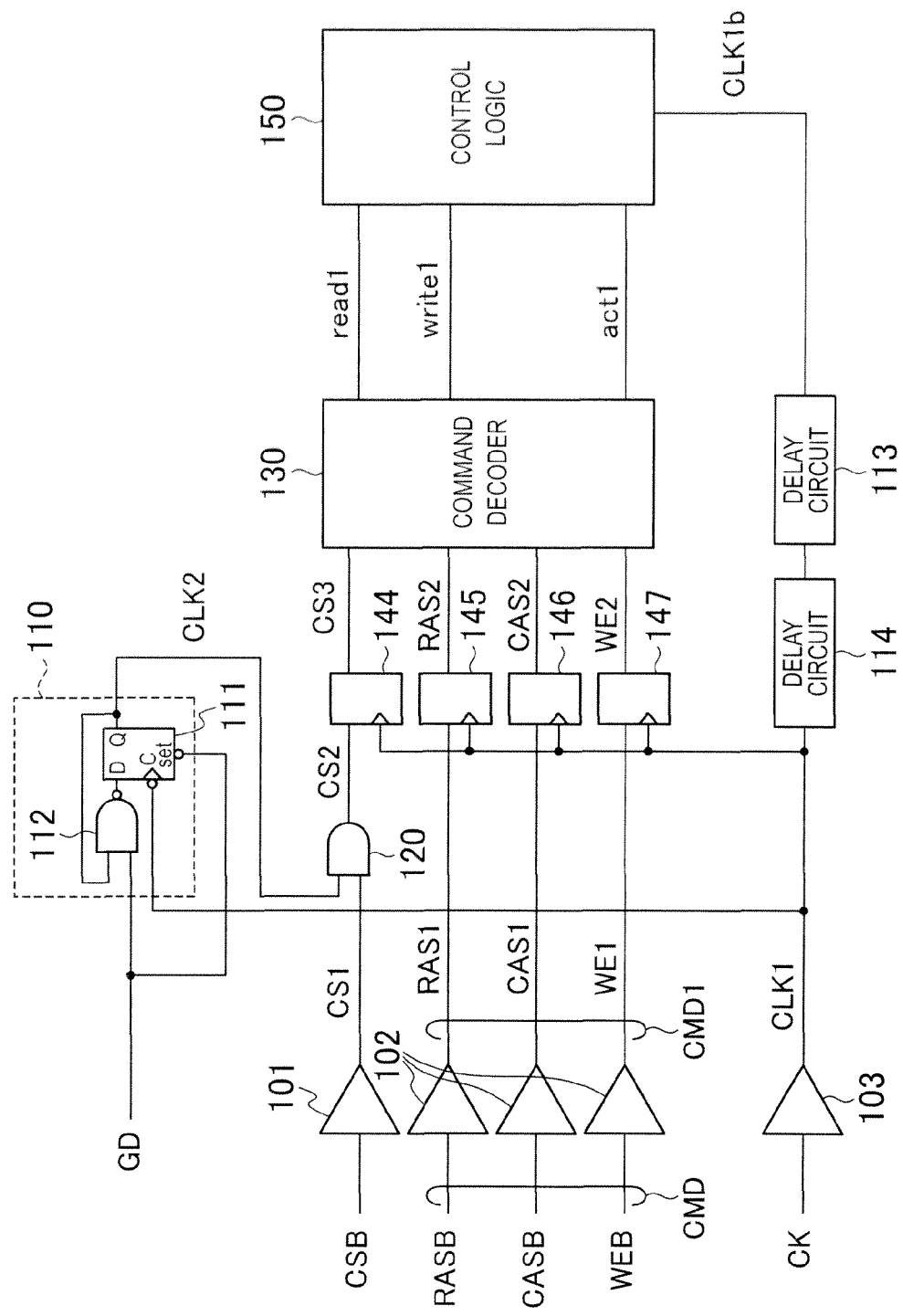
FIG. 11 is a block diagram showing the circuit configuration of essential parts of the access control circuit 20 according to a first modification.

The modification shown in FIG. 11 differs from the circuit shown in FIG. 4 in that flip-flop circuits for latching a command are arranged on the input side of the command decoder 130. Specifically, the flip-flop circuits 141 to 143 shown in FIG. 4 are deleted, and flip-flop circuits 144 to 147 (third latch circuit) are arranged at the prior stage of the command decoder 130 instead. The flip-flop circuits 144 to 147 latch the second chip select signal CS2, the row address strobe signal RAS1, the column address strobe signal CAS1, and the write enable signal WE1, respectively, in synchronization with the first clock signal CLK1. The use of such a circuit configuration can provide the same effects as with the circuit shown in FIG. 4.

A second modification of the access control circuit 20 will be described with reference to FIG. 12.

Figure 12:
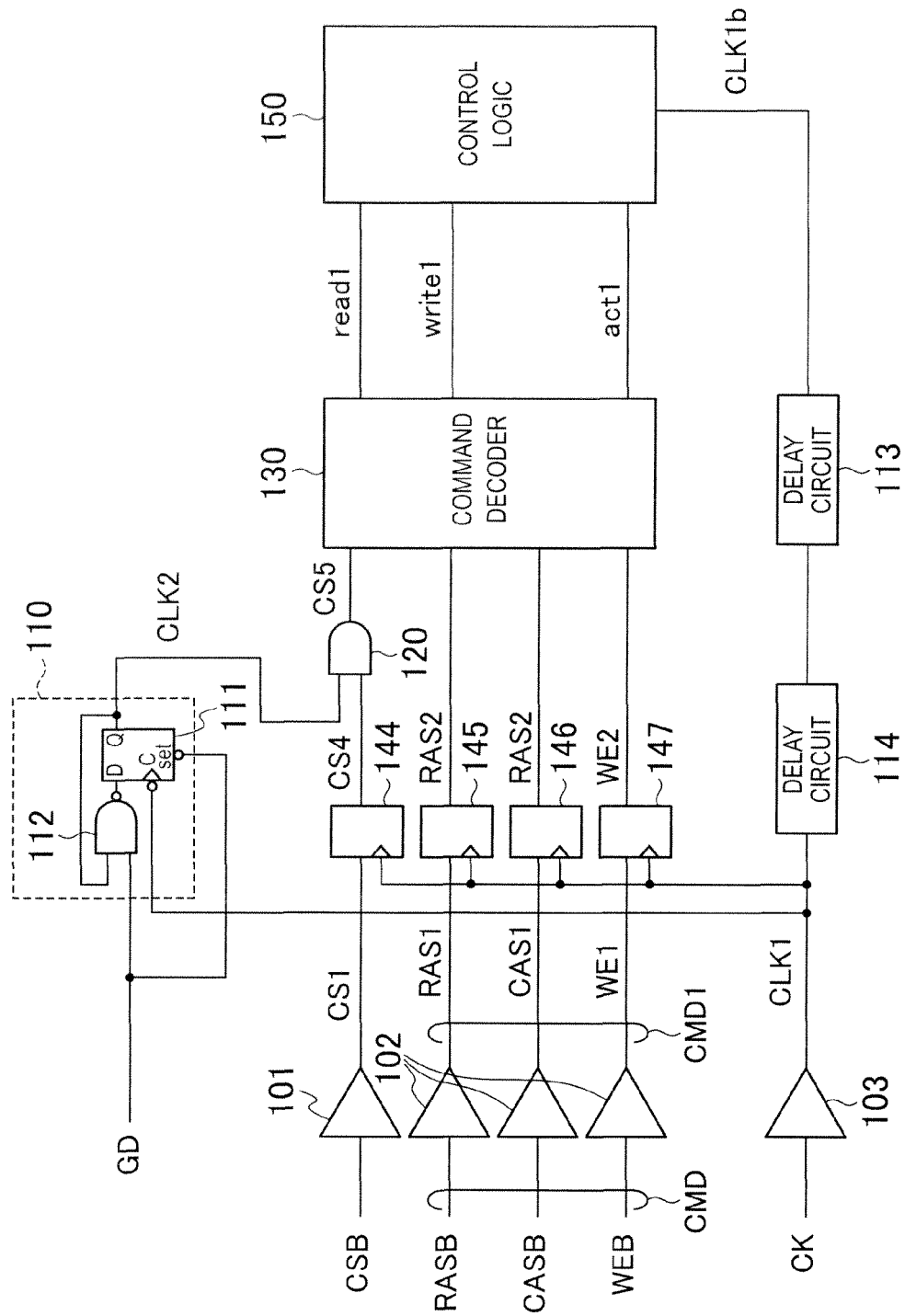
FIG. 12 is a block diagram showing the circuit configuration of essential parts of the access control circuit 20 according to a second modification.

The modification shown in FIG. 12 differs from the circuit shown in FIG. 11 in that the flip-flop circuit 144 is arranged at the prior stage of the AND gate circuit 120. The flip-flop circuits 144 to 147 (second latch circuit) latch the first chip select signal CS1, the row address strobe signal RAS1, the column address strobe signal CAS1, and the write enable signal WE1, respectively, in synchronization with the first clock signal CLK1. The use of such a circuit configuration can provide the same effects as with the circuit shown in FIG. 4.

Next, a second embodiment of the present invention will be described.

A semiconductor device according to the second embodiment has an operation mode called tCAL mode. The tCAL mode refers to an operation mode that allows a latency between the input timing of an external chip select signal CSB and the input timing of an external command signal CMD. When the tCAL mode is OFF (fourth operation mode), the input timing of an external chip select signal CSB and the input timing of an external command signal CMD are set to be the same. When the tCAL mode is ON (third operation mode), a latency as much as a predetermined number of clock cycles is provided between the input timing of an external chip select signal CSB and the input timing of an external command signal CMD. If the tCAL mode is ON, the controller initially issues an external chip select signal CSB, and then issues an external command signal CMD at timing delayed by a predetermined number of clock cycles. This eliminates the need to activate the command receivers 102 all the time. The command receivers 102 can be activated only in a needed period, which allows a reduction in current consumption.

An access control circuit 20 having a tCAL mode will be described with reference to FIG. 13.

Figure 13:
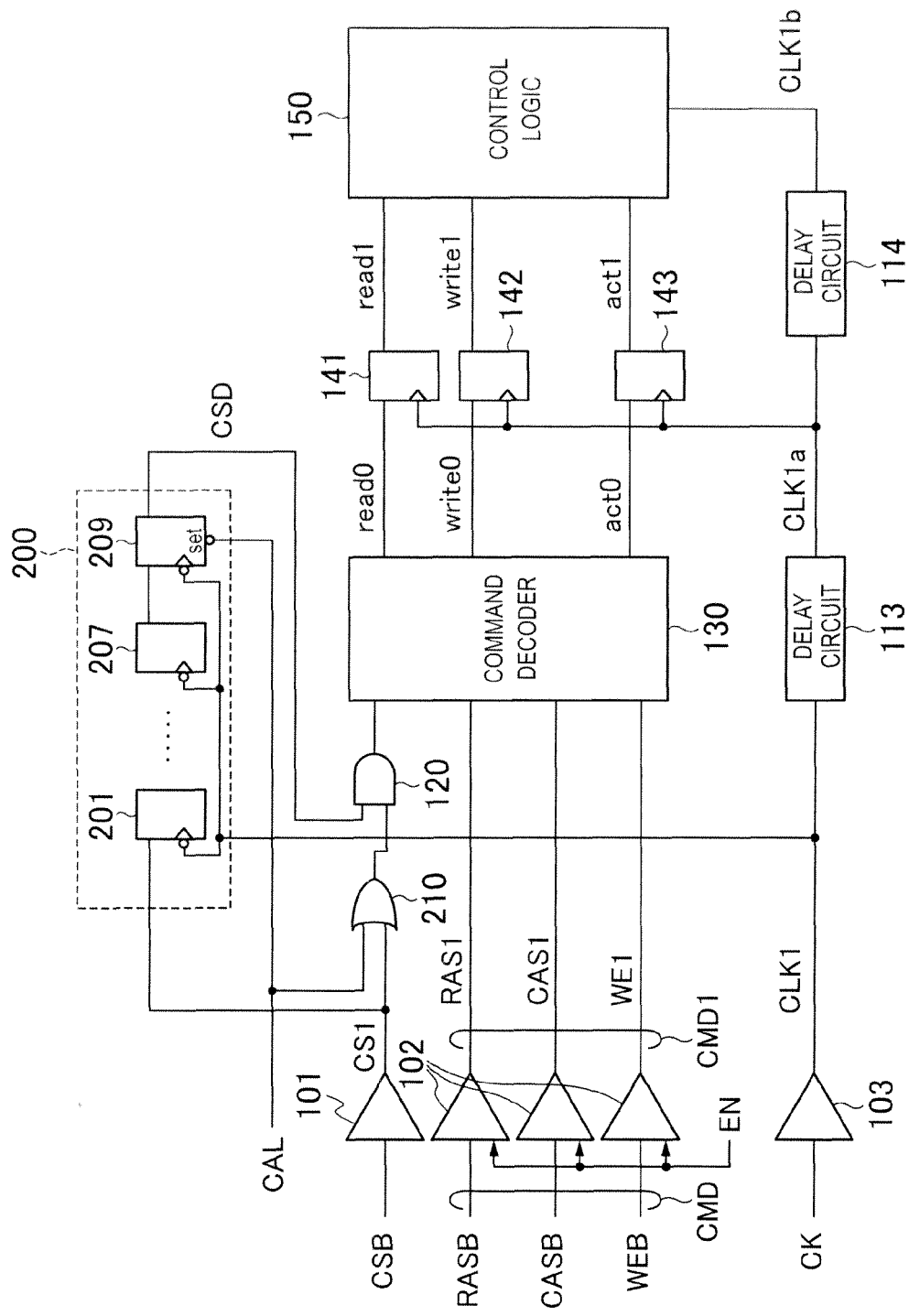
FIG. 13 is a block diagram showing the circuit configuration of essential parts of an access control circuit 20 having a tCAL mode.

The circuit shown in FIG. 13 includes a delay circuit 200 which delays the first chip select signal CS1 in synchronization with the first clock signal CLK1. The delay circuit 200 includes a plurality of flip-flop circuits 201 to 207 and 209 connected in cascade. A tCAL mode signal CAL is supplied to a set node "set" of the flip-flop circuit 209 at the final stage. The tCAL mode signal CAL of high level indicates that the tCAL mode is ON. The tCAL mode signal CAL of low level indicates that the tCAL mode is OFF. If the tCAL mode signal CAL is at a high level (tCAL mode ON), the delay circuit 200 outputs a chip select signal CSD that is delayed by clock cycles as many as the number of stages of the flip-flop circuits 201 to 207 and 209. On the other hand, if the tCAL mode signal CAL is at a low level (tCAL mode OFF), the output of the delay circuit 200 is fixed to a high level.

The delayed chip select signal CSD is supplied to an input node of the AND gate circuit 120. The output of an OR gate circuit 210 is supplied to the other input node of the AND gate circuit 120. The OR gate circuit 210 is a circuit that logically ORs to synthesize the first chip select signal CS1 and the tCAL mode signal CAL. When the tCAL mode signal CAL is at a high level (tCAL mode ON), the output of the OR circuit 210 is thus fixed to a high level.

Figure 14:
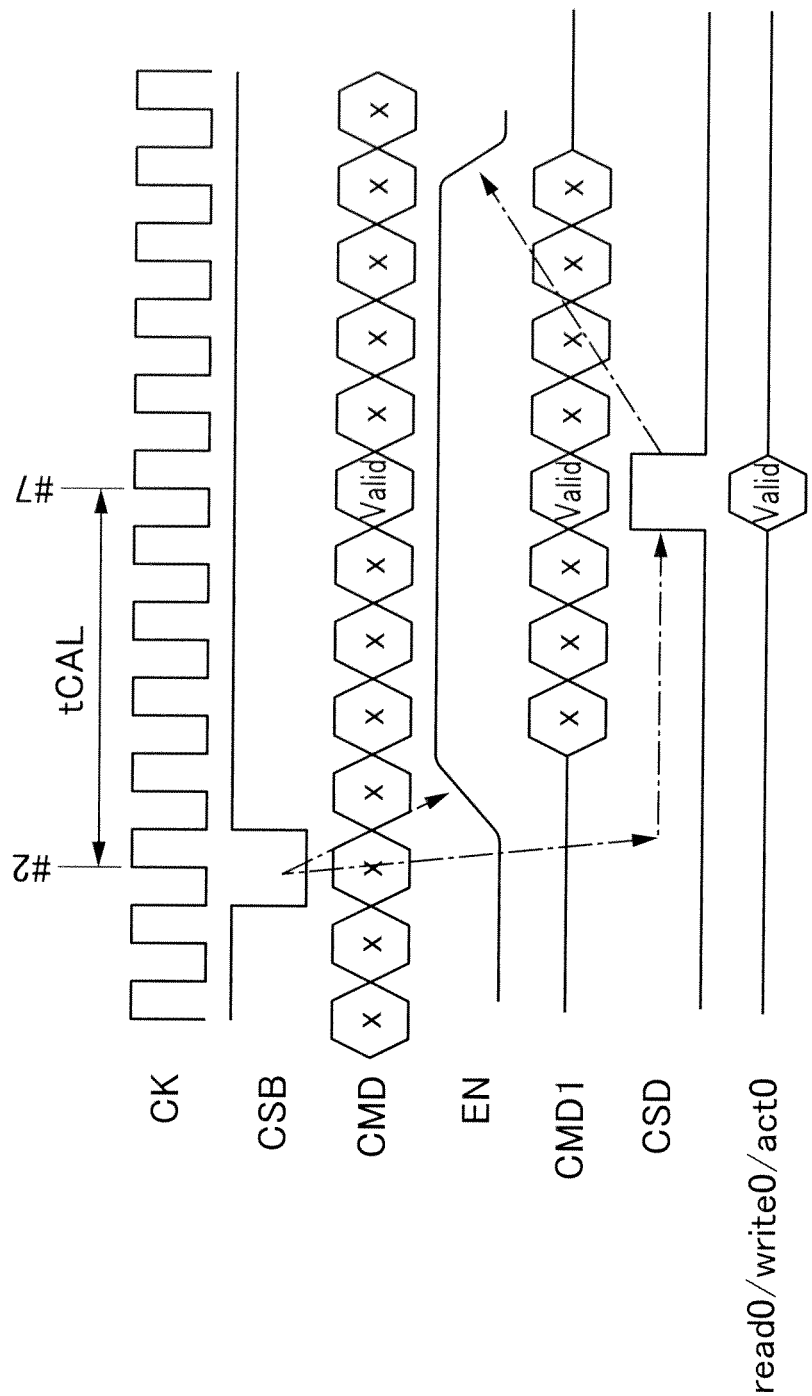
FIG. 14 is a waveform chart for explaining the operation of the circuit shown in FIG.

FIG. 14 shows a case where the amount of delay of the delay circuit 200 is set at five clock cycles. In such a case, when the external chip select signal CSB is activated in synchronization with a rising edge #2 of the external clock signal CK, a not-shown circuit activates a receiver enable signal EN. The receiver enable signal EN is a signal for activating the command receivers 102. In periods before the edge #2, the command receivers 102 are deactivated. After a lapse of five clock cycles from the activation of the external chip select signal CSB, the delay circuit 200 outputs the chip select signal CSD. Meanwhile, external command signals CMD are input at a rising edge #7 that is synchronous with the output of the chip select signal CSD. The external command signals CMD are decoded by the command decoder 130. Consequently, the read signal read0, the write signal write0, and the active signal act0 are generated. Subsequently, the receiver enable signal EN is deactivated to cut down the current consumption of the command receivers 102.

As described above, when the tCAL mode is ON, the command receivers 102 are deactivated before the input of the external chip select signal CSB. The command receivers 102 are activated after the input of the external chip select signal CSB. This reduces the current consumption of the command receivers 102.

Note that a predetermined time is needed between when the receiver enable signal EN is activated and when the command receivers 102 actually become capable of accepting an external command signal CMD. Similarly, a predetermined time is needed between when the receiver enable signal EN is deactivated and when the command receivers 102 are actually disabled from accepting an external command signal CMD. This means that the acceptance of external command signals CMD is disabled only at certain timing. External command signals CMD can even be accepted before and after that timing. In the example shown in FIG. 14, external command signals CMD are input in synchronization with the rising edge #7 of the external clock signal CK. However, the command receivers 102 can also accept commands even if external command signals CMD are accidentally input in synchronization with the rising edges #6 and #8. Such accidentally-accepted commands are nullified because the command decoder 130 is activated only at the timing when the delayed chip select signal CSD is output.

An access control circuit 20 having both a tCAL mode and a gear down mode will be described with reference to FIG. 15.

Figure 15:
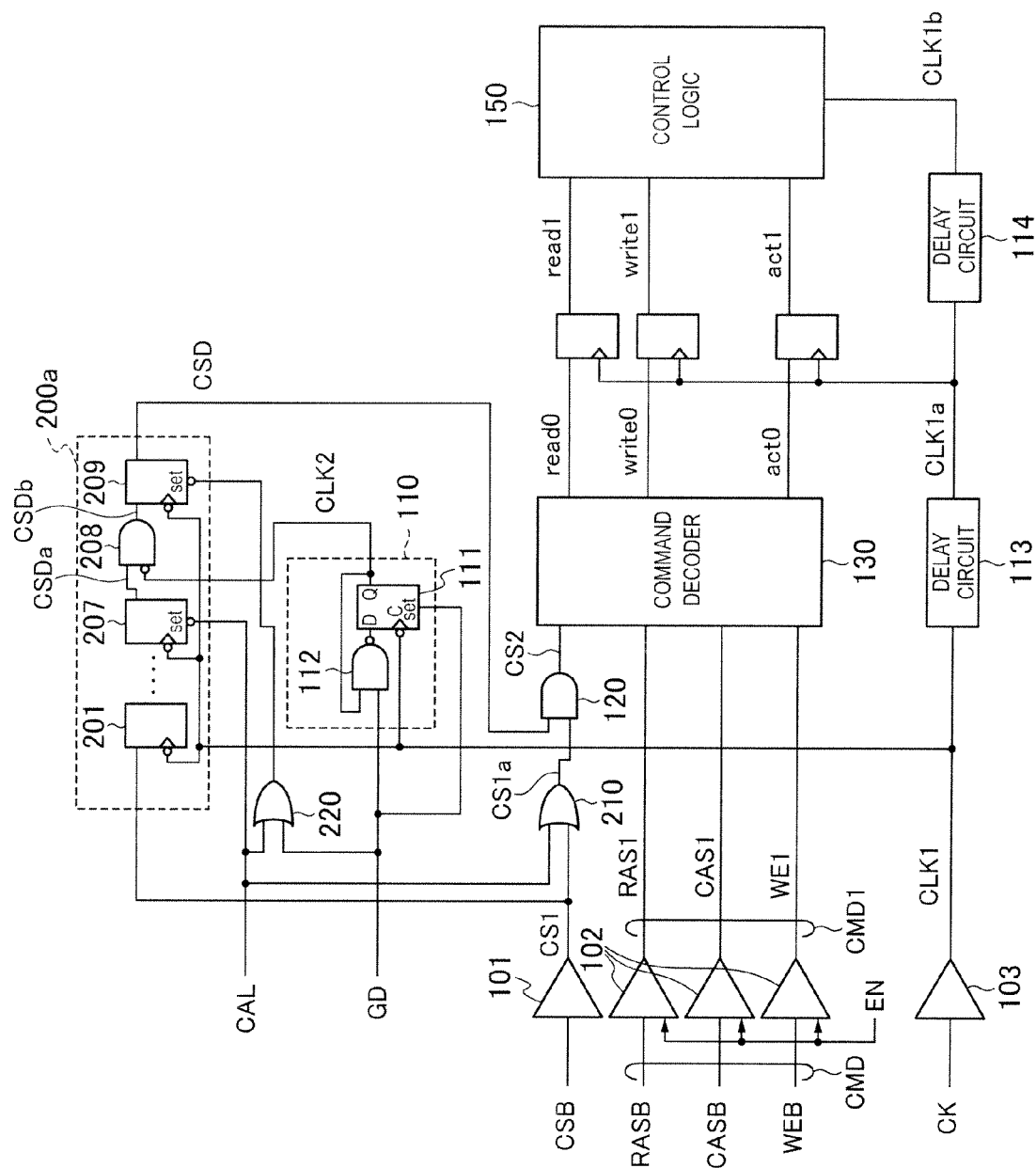
FIG. 15 is a block diagram showing the circuit configuration of essential parts of an access control circuit 20 having both a tCAL mode and a gear down mode.

The circuit shown in FIG. 15 is configured so that a delay circuit 200a and OR gate circuits 210 and 220 are added to the circuit shown in FIG. 4. In other respects, the configuration is the same as that of the circuit shown in FIG. 4. The same components will thus be designated by like reference symbols. Redundant description will be omitted.

The delay circuit 200a is configured so that an AND gate circuit 208 (second logic circuit) is added to the delay circuit 200 shown in FIG. 13. The AND gate circuit 208 is interposed between the flip-flop circuit 207 at the second-to-last stage and the flip-flop circuit 209 at the final stage. An inverted signal of the second clock signal CLK2 is supplied to the other input node of the AND gate circuit 208. The tCAL mode signal CAL is supplied to the set node "set" of the flip-flop circuit 207. The output of the OR gate circuit 220 is supplied to the set node "set" of the flip-flop circuit 209. The OR gate circuit 220 is a circuit that logically ORs to synthesize the tCAL mode signal CAL and the gear down signal GD.

Having both the tCAL mode and the gear down mode, the circuit shown in FIG. 15 has a total of four operation modes. Each operation mode will be described below with reference to a waveform chart.

Figure 16:
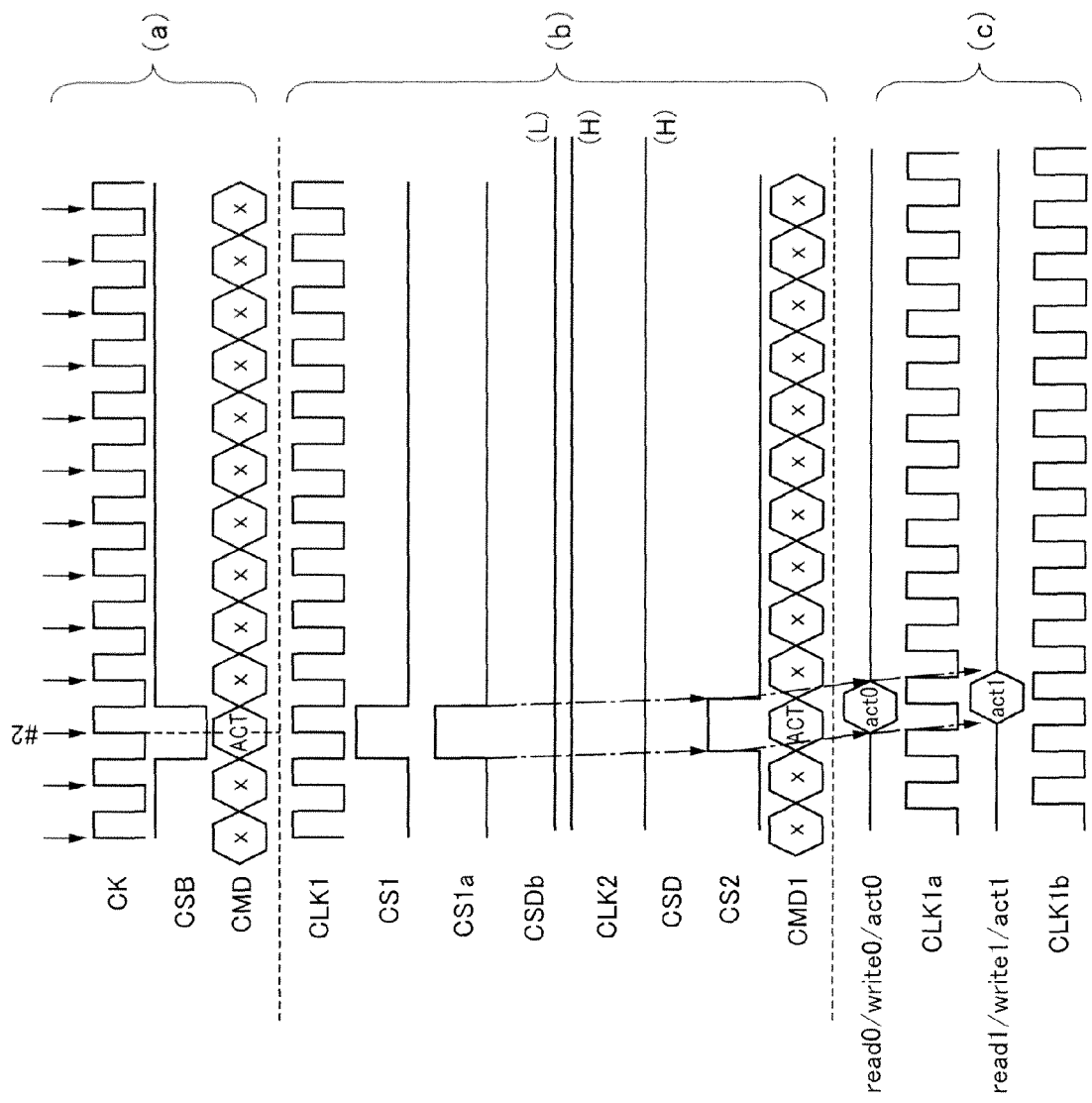
FIG. 16 is an operation waveform chart for explaining a case where the tCAL mode is OFF and the gear down mode is OFF.

The operation of the access control circuit 20 in which the tCAL mode is OFF and the gear down mode is OFF will be described with reference to FIG. 16.

When the tCAL mode is OFF and the gear down mode is OFF, both the tCAL mode signal CAL and the gear down signal GD are at low level. In such a case, the flip-flop circuit 209 at the final stage of the delay circuit 200a is set and the chip select signal CSD is fixed to a high level. The second chip select signal CS2 thus has the same waveform as that of the first chip select signal CS1. This results in the same operation as when the gear down signal GD is at a low level in the circuit shown in FIG. 4 (see FIG. 7).

Figure 17:
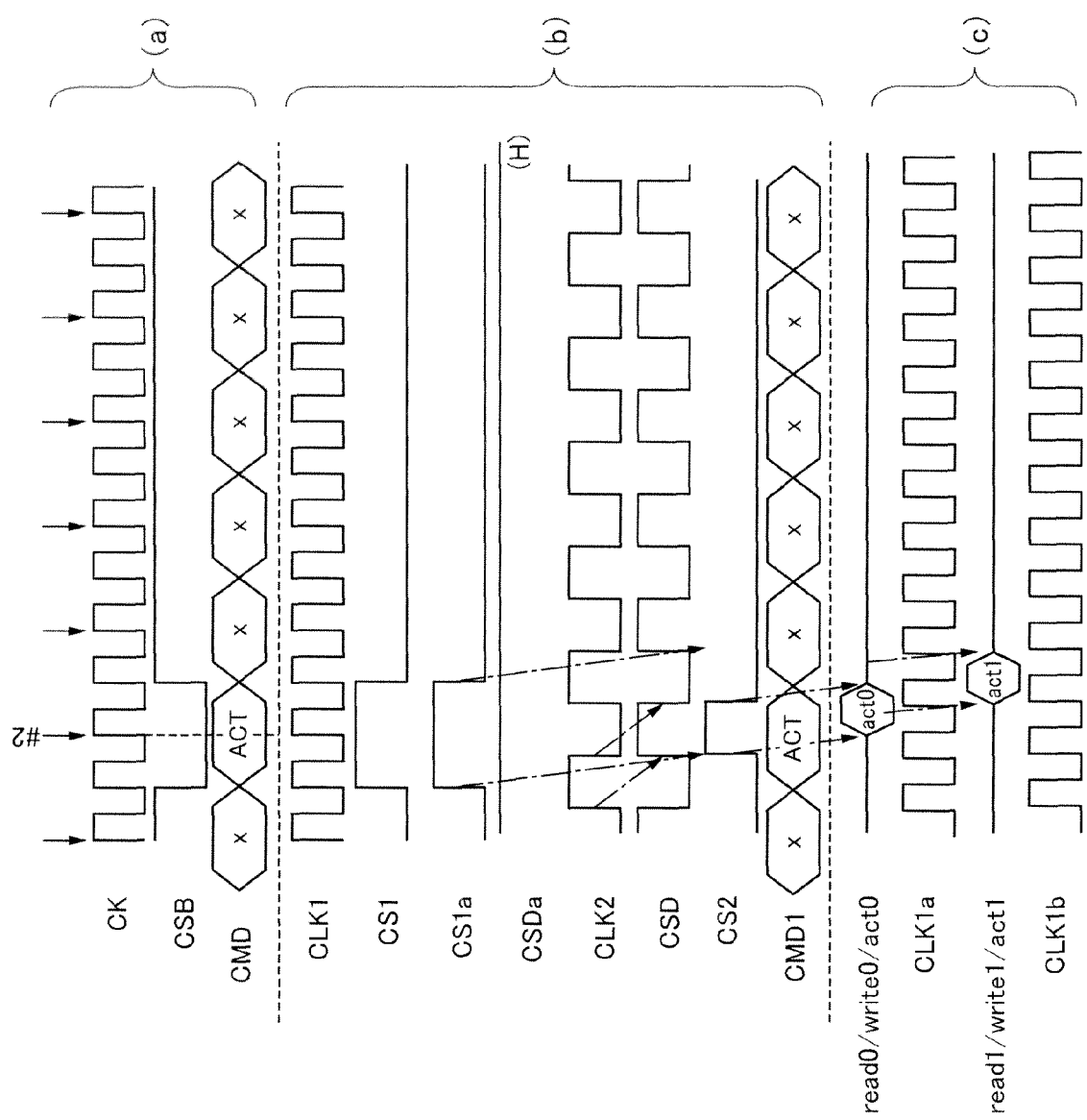

The operation of the access control circuit 20 in which the tCAL mode is OFF and the gear down mode is ON will be described with reference to FIG. 17.

When the tCAL mode is OFF and the gear down mode is ON, the tCAL mode signal CAL is at a low level and the gear down signal GD is at a high level. In such a case, the flip-flop circuit 207 included in the delay circuit 200a is set. A chip select signal CSDa (third chip select signal), the output of the flip-flop circuit 207, is thus fixed to a high level. Meanwhile, the second clock signal CLK2 frequency-divided by the frequency division circuit 110 is input to the AND gate circuit 208. The chip select signal CSD output from the delay circuit 200 is inverted in synchronization with the falling edges of the first clock signal CLK1. The chip select signal CSD generated thus is supplied to the AND gate circuit 120. This results in the same operation as when the gear down signal GD is at a high level in the circuit shown in FIG. 4 (see FIG. 8).

Figure 18:
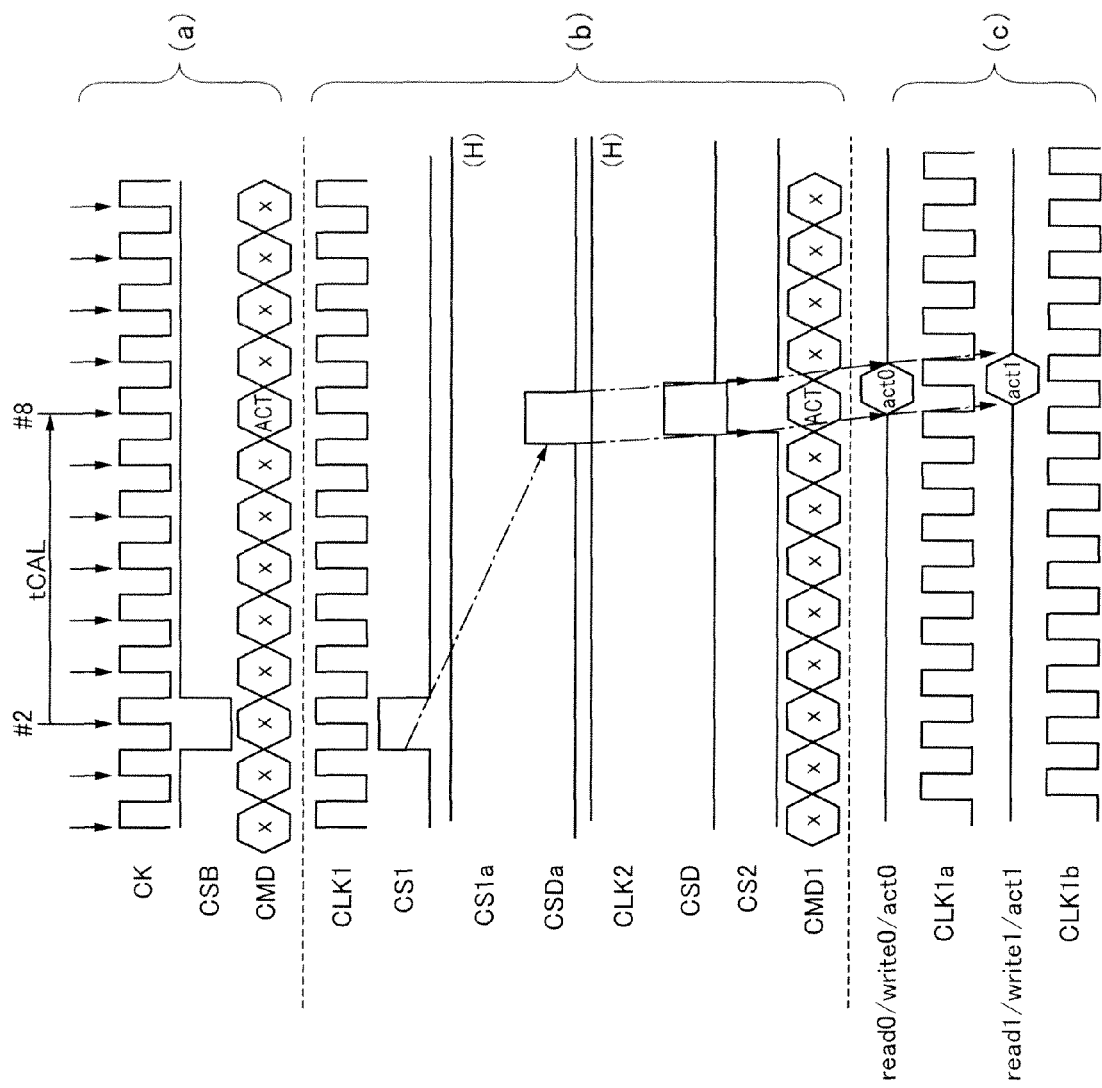
FIG. 18 is an operation waveform chart for explaining a case where the tCAL mode is ON and the gear down mode is OFF.

The operation of the access control circuit 20 in which the tCAL mode is ON and the gear down mode is OFF will be described with reference to FIG. 18.

When the tCAL mode is ON and the gear down mode is OFF, the tCAL mode signal CAL is at a high level and the gear down signal GD is at a low level. In such a case, the output of the OR gate circuit 210 is fixed to a high level. Since the second clock signal CLK2 is also fixed to a high level, the delay circuit 200a delays the input first chip select signal CS1 as much as the number of stages of the flip-flop circuits and outputs the resultant as the chip select signal CSD. Consequently, the command decoder 130 is activated in synchronization with the chip select signal CSD, and decodes first command signals CMD1 input at that timing. In the example shown in FIG. 18, the number of stages of flip-flop circuits that constitute the delay circuit 200 is six. This enables the external command signals CMD that are input at the edge #8, lagging six clock cycles behind the edge #2 at which the external chip select signal CSB is input.

Figure 19:
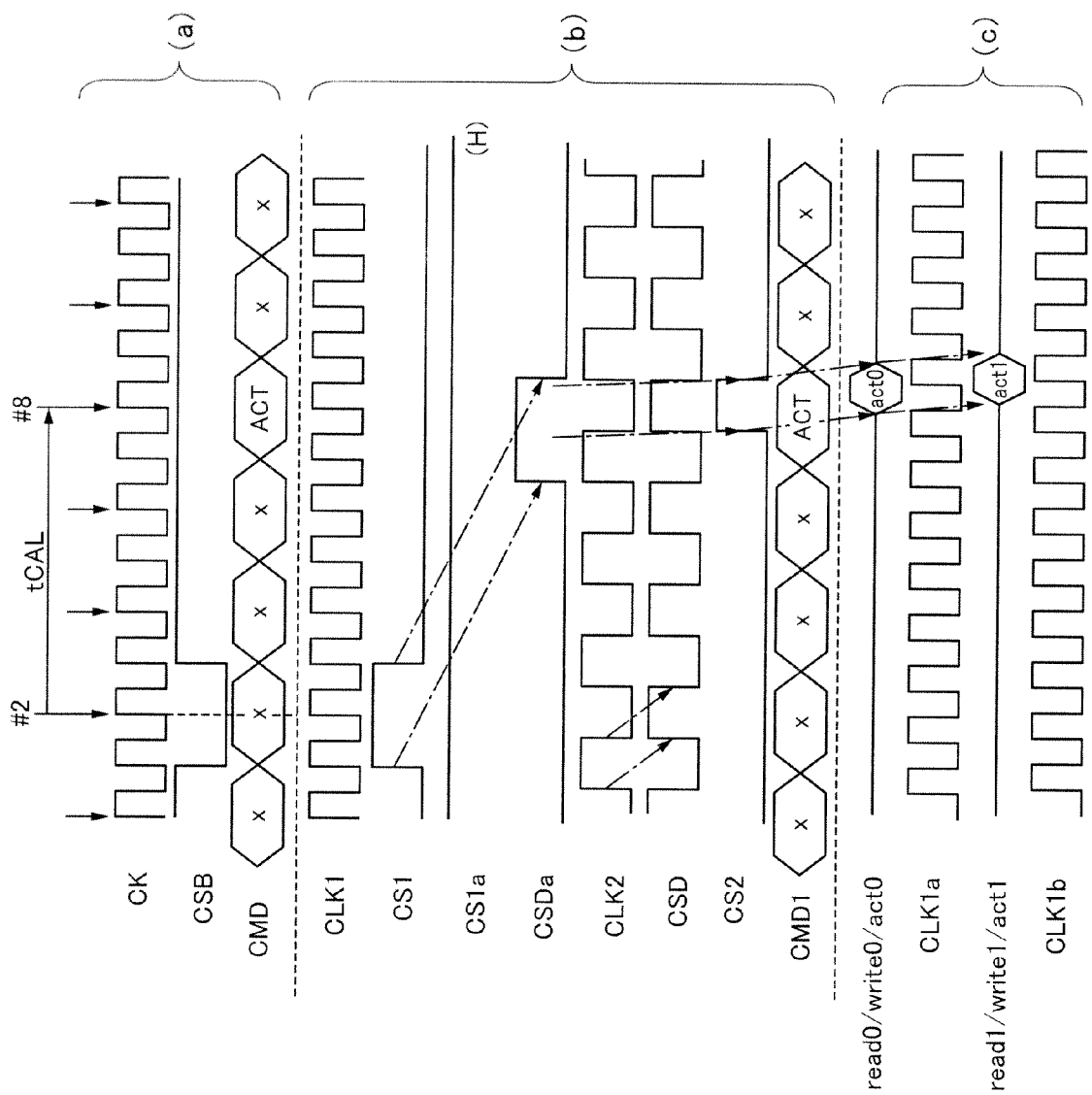

The operation of the access control circuit 20 in which the tCAL mode is ON and the gear down mode is ON will be described with reference to FIG. 19.

When the tCAL mode is ON and the gear down mode is ON, both the tCAL mode signal CAL and the gear down signal GD are at a high level. In such a case, the second clock signal CLK2 is inverted in synchronization with the falling edges of the first clock signal CLK1. The first chip select signal CS1 has a pulse width of longer than one clock cycle, which is reduced to a pulse width of one clock cycle by the AND gate circuit 208. As a result, the chip select signal CSD output from the delay circuit 200*a* has the same waveform as that of the chip select signal CSD shown in FIG. 18. This allows the same operation as in the example shown in FIG. 18.

According to the present embodiment, a latency can be provided between the input timing of the external chip select signal CSB and the input timing of the external command signals CMD. This can reduce the current consumption of the command receivers 102. As shown in FIG. 15, since the circuitry for controlling the gear down mode can also be merged, the circuit configuration will not be much complicated even if both the tCAL mode and the gear down mode are implemented. The second latch circuit of FIG. 12 (the flip-flop circuits 144 to 147) or the third latch circuit of FIG. 11 (the flip-flop circuits 144 to 147) may be applied instead of the first latch circuit of FIG. 15 (the flip-flop circuits interposed between the command decoder 130 and the control logic 150).

It is apparent that the present invention is not limited to the above embodiments, but may be modified and changed without departing from the scope and spirit of the invention.

For example, the technical concept of the present invention may be applied to a semiconductor device that includes a volatile or nonvolatile memory. The forms of the circuits in the circuit blocks disclosed in the drawings and other circuits for generating control signals are not limited to the forms of the circuits disclosed in the foregoing embodiment.

When the transistors are field effect transistors (FETs), various FETs are applicable, including MIS (Metal Insulator Semiconductor) and TFT (Thin Film Transistor) as well as MOS (Metal Oxide Semiconductor). The device may even include bipolar transistors. For example, the present invention can be applied to a general semiconductor device such as a CPU (Central Processing Unit), an MCU (Micro Control Unit), a DSP (Digital Signal Processor), an ASIC (Application Specific Integrated Circuit), and an ASSP (Application Specific Standard Circuit), each of which includes a memory function. An SOC (System on Chip), an MCP (Multi Chip Package), and a POP (Package on Package) and so on are pointed to as examples of types of semiconductor device to which the present invention is applied. The present invention can be applied to the semiconductor device that has these arbitrary product form and package form.

When the transistors are field effect transistors (FETs), various FETs are applicable, including MIS (Metal Insulator Semiconductor) and TFT (Thin Film Transistor) as well as MOS (Metal Oxide Semiconductor). The device may even include bipolar transistors.

In addition, an NMOS transistor (N-channel MOS transistor) is a representative example of a first conductive transistor, and a PMOS transistor (P-channel MOS transistor) is a representative example of a second conductive transistor.

Many combinations and selections of various constituent elements disclosed in this specification can be made within the scope of the appended claims of the present invention. That is, it is needles to mention that the present invention embraces the entire disclosure of this specification including the claims, as well as various changes and modifications which can be made by those skilled in the art based on the technical concept of the invention.

In addition, while not specifically claimed in the claim section, the applicant reserves the right to include in the claim section of the application at any appropriate time the following devices, methods and systems:

A1. A semiconductor device comprising:

a delay circuit that delays a first chip select signal to generate a second chip select signal, the first chip select signal defining whether or not to enable a first command signal supplied to the semiconductor device in synchronization with a first clock signal; and a command generation circuit that generates a second command signal based on the first command signal, the first command signal defining an operation mode of the semiconductor device, wherein the command generation circuit is activated based on the second chip select signal when in a third operation mode, and is activated based on the first chip select signal when in a fourth operation mode.

A2 The semiconductor device according to A1, further comprising a logic circuit that supplies either one of the first and second chip select signals to the command generation circuit.

A3. The semiconductor device according to A1, further comprising a mode register that selects one of the third and fourth operation modes.

A4. The semiconductor device according to A1, wherein the command generation circuit generates the second command signal by decoding the first command signal.

A5. The semiconductor device according to A1, further comprising a frequency division circuit that divides a frequency of the first clock signal to generate a second clock signal, wherein the delay circuit generates the second chip select signal in synchronization with the second clock signal when both a first operation mode and the third operation mode is selected, and the delay circuit generates the second chip select signal in synchronization with the first clock signal when both a second operation mode and the third operation mode is selected.

A6. The semiconductor device according to A5, further comprising a first latch circuit that holds the second command signal in synchronization with the first clock signal.

A7. The semiconductor device according to A5, further comprising a second latch circuit that holds the first command signal and the first chip select signal in synchronization with the first clock signal.

A8. The semiconductor device according to A5, further comprising a third latch circuit that holds the first command signal and the second chip select signal in synchronization with the first clock signal.

A9. The semiconductor device according to A1, further comprising:

a clock receiver that receives an external clock signal supplied from outside of the device and outputs the first clock signal;

a chip select receiver that receives an external chip select signal supplied from outside of the device and outputs the first chip select signal; and a command receiver that receives an external command signal supplied from outside of the device and outputs the first command signal.

A10. A method of controlling a semiconductor device, comprising:
delaying a first chip select signal to generate a second chip select signal in a third operation mode, the first chip select signal defining whether or not to enable a first command signal supplied to the semiconductor device in synchronization with a first clock signal;
activating a command generation circuit in response to the second chip select signal in a third operation mode;
activating the command generation circuit in response to the first chip select signal regardless of the first clock signal in a fourth operation mode;
generating a second command signal by supplying the first command signal to the command generation circuit that is activated, the first command signal defining an operation mode of the semiconductor device.

A11. The method of controlling a semiconductor device according to A10, further comprising:
receiving an external clock signal supplied from outside and generating the first clock signal;
receiving an external chip select signal supplied from outside and generating the first chip select signal; and
receiving an external command signal supplied from outside and generating the first command signal.

A12. The method of controlling a semiconductor device according to A10, further comprising generating a second clock signal having a frequency lower than that of the first clock signal in a first operation mode, wherein
the command generation circuit is activated in synchronization with the second clock signal in the first operation mode, and
the command generation circuit is activated in synchronization with the first clock signal in a second operation mode.

A13. The method of controlling a semiconductor device according to A10, wherein either one of the third and fourth operation modes is selected by a mode register included in the semiconductor device.

A14. The method of controlling a semiconductor device according to A12, wherein either one of the first and second operation modes is selected by a mode register included in the semiconductor device.

A15. An information processing system including:
a first semiconductor device that outputs an external clock signal, an external chip select signal, and an external command signal; and
a second semiconductor device comprising:
a clock receiver that receives the external clock signal supplied from the first semiconductor device and outputs a first clock signal;
a chip select receiver that receives the external chip select signal supplied from the first semiconductor device and outputs a first chip select signal;
a command receiver that receives the external command signal supplied from the first semiconductor device and outputs a first command signal;
a delay circuit that delays the first chip select signal to generate a second chip select signal, the first chip select signal defining whether or not to enable the first command signal supplied to the second semiconductor device in synchronization with the first clock signal; and
a command generation circuit that generates a second command signal based on the first command signal, the first command signal defining an operation mode of the first semiconductor device,
wherein the command generation circuit is activated based on the second chip select signal when in a third operation mode, and is activated based on the first chip select signal when in a fourth operation mode.

A16. The information processing system according to A15, wherein the first semiconductor device brings the second semiconductor device into either one of the third and fourth operation modes.

A17. The information processing system according to A15, wherein
the second semiconductor device further comprises a frequency division circuit that divides a frequency of the first clock signal to generate a second clock signal,
the delay circuit generates the second chip select signal in synchronization with the second clock signal when both a first operation mode and the third operation mode is selected,
the delay circuit generates the second chip select signal in synchronization with the first clock signal when both a second operation mode and the third operation mode is selected, and
the first semiconductor device brings the second semiconductor device into either one of the first and second operation modes.

What is claimed is:

1. A semiconductor device comprising:
a frequency division circuit that divides a frequency of a first clock signal to generate a second clock signal;
a first logic circuit that receives a first chip select signal and the second clock signal to generate a second chip select signal; and
a command generation circuit that is activated based on the second chip select signal, and generates a second command signal based on a first command signal,
wherein the frequency division circuit divides the frequency of the first clock signal to generate the second clock signal in a first operation mode, and fixes a logic level of the second clock signal in a second operation mode.

2. The semiconductor device as claimed in claim 1, further comprising a mode register that selects one of the first and second operation modes.

3. The semiconductor device as claimed in claim 1, wherein the command generation circuit generates the second command signal by decoding the first command signal.

4. The semiconductor device as claimed in claim 1, further comprising a first latch circuit that holds the second command signal in synchronization with the first clock signal.

5. The semiconductor device as claimed in claim 1, further comprising a second latch circuit that holds the first command signal and the first chip select signal in synchronization with the first clock signal.

6. The semiconductor device as claimed in claim 1, further comprising a third latch circuit that holds the first command signal and the second chip select signal in synchronization with the first clock signal.

7. The semiconductor device as claimed in claim 1, further comprising:
a clock receiver that receives an external clock signal supplied from outside of the device and outputs the first clock signal;
a chip select receiver that receives an external chip select signal supplied from outside of the device and outputs the first chip select signal; and
a command receiver that receives an external command signal supplied from outside of the device and outputs the first command signal.

8. The semiconductor device as claimed in claim 1, further comprising:
   a delay circuit that generates a third chip select signal by delaying the first chip select signal in synchronization with the first clock signal; and
   a second logic circuit that receives the third chip select signal and the second clock signal to generate the second chip select signal.

9. The semiconductor device as claimed in claim 8, wherein the delay circuit delays the first chip select signal to generate the third chip select signal in a third operation mode, and fixes a logic level of the third chip select signal in a fourth operation mode.

10. A method of controlling a semiconductor device, comprising:
    dividing a frequency of a first clock signal to generate a second clock signal;
    activating, in a first operation mode, a command generation circuit when both the second clock signal and a first chip select signal are activated;
    activating, in a second operation mode, the command generation circuit when the first chip select signal is activated, the second clock signal being held at a fixed logic level; and
    generating a second command signal by supplying a first command signal to the command generation circuit that is activated.

11. The method of controlling a semiconductor device as claimed in claim 10, wherein the second command signal is held based on the first clock signal regardless of which of the first and second operation modes is selected.

12. The method of controlling a semiconductor device as claimed in claim 10, wherein the first command signal and the first chip select signal are held based on the first clock signal regardless of which of the first and second operation modes is selected.

13. The method of controlling a semiconductor device as claimed in claim 10, wherein the first command signal and the second chip select signal are held based on the first clock signal regardless of which of the first and second operation modes is selected.

14. The method of controlling a semiconductor device as claimed in claim 10, further comprising:
    generating the first clock signal based on an external clock signal supplied from outside of the device;
    generating the first chip select signal based on an external chip select signal supplied from outside of the device; and
    generating the first command signal based on an external command signal supplied from outside of the device.

15. The method of controlling a semiconductor device as claimed in claim 10, wherein
    the first chip select signal is delayed in synchronization with the first clock signal to generate the third chip select signal in a third operation mode, and
    the command generation circuit is activated when both the third chip select signal and the second clock signal are activated.

16. The method of controlling a semiconductor device as claimed in claim 15, wherein the third chip select signal is activated regardless of the first chip select signal in a fourth operation mode.

17. The method of controlling a semiconductor device as claimed in claim 10, wherein either one of the first and second operation modes is selected by a mode register included in the semiconductor device.

18. An information processing system comprising:
    a first semiconductor device that outputs an external clock signal, an external chip select signal, and an external command signal; and
    a second semiconductor device comprising:
      a clock receiver that receives the external clock signal supplied from the first semiconductor device and outputs a first clock signal;
      a chip select receiver that receives the external chip select signal supplied from the first semiconductor device and outputs a first chip select signal;
      a command receiver that receives the external command signal supplied from the first semiconductor device and outputs a first command signal;
      a frequency division circuit that divides a frequency of the first clock signal to generate a second clock signal;
      a first logic circuit that receives the first chip select signal and the second clock signal to generate a second chip select signal; and
      a command generation circuit that is activated based on the second chip select signal, and generates a second command signal based on the first command signal,
    wherein the first semiconductor device brings the second semiconductor device into either one of first and second operation modes, and
    the frequency division circuit divides the frequency of the first clock signal to generate the second clock signal in the first operation mode, and fixes a logic level of the second clock signal in the second operation mode.

19. The method of claim 14, wherein said first and second operation modes are directed to whether a gear down mode is activated, wherein in said gear down mode inputs for the external command signal are enabled at every n active edges of the external command signal, where n is a power of 2.

20. The method of claim 10, wherein said second command signal is activated within a same single clock period of said first clock signal, regardless of whether said first operation mode is active or said second operation mode is active.

* * * * *